US008295104B2

(12) United States Patent
Abe et al.

(10) Patent No.: US 8,295,104 B2
(45) Date of Patent: Oct. 23, 2012

(54) SEMICONDUCTOR DEVICE

(75) Inventors: Hiroko Abe, Setagaya (JP); Mikio Yukawa, Atsugi (JP); Tamae Takano, Atsugi (JP); Yoshinobu Asami, Atsugi (JP); Kiyoshi Kato, Isehara (JP); Ryoji Nomura, Yamato (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 426 days.

(21) Appl. No.: 12/618,161

(22) Filed: Nov. 13, 2009

(65) Prior Publication Data
US 2010/0055896 A1    Mar. 4, 2010

Related U.S. Application Data

(62) Division of application No. 11/547,905, filed as application No. PCT/JP2005/021930 on Nov. 22, 2005, now Pat. No. 7,688,624.

(30) Foreign Application Priority Data

Nov. 26, 2004    (JP) ................................. 2004-343177

(51) Int. Cl.
*G11C 7/00*    (2006.01)
(52) U.S. Cl. .................... 365/192; 340/10.1; 340/572.7; 365/104
(58) Field of Classification Search .................. 365/104, 365/192; 340/2.1–2.8, 10.1–10.6, 10.5, 10.51, 340/572.1–572.9; 700/215, 221, 225, 227; 726/20; 235/375–385, 492; 455/150.1, 151.1
See application file for complete search history.

(56) References Cited

U.S. PATENT DOCUMENTS

| 3,833,894 A | 9/1974 | Aviram et al. |
| 5,296,716 A | 3/1994 | Ovshinsky et al. |

(Continued)

FOREIGN PATENT DOCUMENTS

CN    1543652    11/2004
(Continued)

OTHER PUBLICATIONS

International Search Report (Application No. PCT/JP2005/021930) dated Mar. 7, 2006.

(Continued)

*Primary Examiner* — Alexander Sofocleous
*Assistant Examiner* — Harry W Byrne
(74) *Attorney, Agent, or Firm* — Eric J. Robinson; Robinson Intellectual Property Law Office, P.C.

(57)    ABSTRACT

It is an object of the present invention to provide a volatile organic memory in which data can be written other than during manufacturing and falsification by rewriting can be prevented, and to provide a semiconductor device including such an organic memory. It is a feature of the invention that a semiconductor device includes a plurality of bit lines extending in a first direction; a plurality of word lines extending in a second direction different from the first direction; a memory cell array including a plurality of memory cells each provided at one of intersections of the bit lines and the word lines; and memory elements provided in the memory cells, wherein the memory elements include bit lines, an organic compound layer, and the word lines, and the organic compound layer includes a layer in which an inorganic compound and an organic compound are mixed.

3 Claims, 21 Drawing Sheets

U.S. PATENT DOCUMENTS

| | | | |
|---|---|---|---|
| 5,375,250 A | 12/1994 | Van den Heuvel | |
| 5,536,947 A | 7/1996 | Klersy et al. | |
| 6,097,622 A | 8/2000 | Shimizu et al. | |
| 6,340,588 B1 | 1/2002 | Nova et al. | |
| 6,528,815 B1 | 3/2003 | Brown et al. | |
| 6,683,322 B2 | 1/2004 | Jackson et al. | |
| 6,683,802 B2 | 1/2004 | Katoh | |
| 6,768,157 B2 | 7/2004 | Krieger et al. | |
| 6,806,526 B2 | 10/2004 | Krieger et al. | |
| 6,809,952 B2 | 10/2004 | Masui | |
| 6,815,286 B2 | 11/2004 | Krieger et al. | |
| 6,818,920 B2 | 11/2004 | De Leeuw et al. | |
| 6,838,720 B2 | 1/2005 | Krieger et al. | |
| 6,847,047 B2 | 1/2005 | VanBuskirk et al. | |
| 6,858,481 B2 | 2/2005 | Krieger et al. | |
| 6,864,118 B2 | 3/2005 | Stasiak | |
| 6,864,522 B2 | 3/2005 | Krieger et al. | |
| 6,947,321 B2 | 9/2005 | Tanabe | |
| 6,950,331 B2 | 9/2005 | Yang et al. | |
| 6,977,389 B2 | 12/2005 | Tripsas et al. | |
| 6,992,323 B2 | 1/2006 | Krieger et al. | |
| 7,026,702 B2 | 4/2006 | Krieger et al. | |
| 7,035,140 B2 | 4/2006 | Jackson et al. | |
| 7,050,326 B2 | 5/2006 | Anthony | |
| 7,220,985 B2 | 5/2007 | Cheung et al. | |
| 7,254,053 B2 | 8/2007 | Krieger et al. | |
| 7,274,035 B2 | 9/2007 | Yang et al. | |
| 7,276,727 B2 | 10/2007 | Stasiak | |
| 7,359,230 B2 | 4/2008 | Sumida et al. | |
| 7,499,305 B2 | 3/2009 | Nomura et al. | |
| 7,518,692 B2 | 4/2009 | Yamazaki et al. | |
| 7,557,372 B2 | 7/2009 | Yang et al. | |
| 7,816,721 B2* | 10/2010 | Yamazaki et al. | 257/306 |
| 2002/0094639 A1 | 7/2002 | Reddy | |
| 2004/0164302 A1 | 8/2004 | Arai et al. | |
| 2005/0174875 A1 | 8/2005 | Katoh | |
| 2006/0267068 A1 | 11/2006 | Sato et al. | |
| 2007/0194301 A1 | 8/2007 | Sezi et al. | |
| 2007/0215869 A1 | 9/2007 | Moriya et al. | |
| 2008/0036680 A1* | 2/2008 | Ito et al. | 343/873 |
| 2008/0042180 A1 | 2/2008 | Yamazaki et al. | |
| 2008/0048180 A1* | 2/2008 | Abe et al. | 257/40 |
| 2008/0123396 A1 | 5/2008 | Kato et al. | |
| 2008/0210928 A1* | 9/2008 | Abe et al. | 257/40 |
| 2009/0121874 A1 | 5/2009 | Nomura et al. | |

FOREIGN PATENT DOCUMENTS

| | | |
|---|---|---|
| EP | 1 341 186 | 9/2003 |
| EP | 1 434 232 | 6/2004 |
| EP | 1513159 A | 3/2005 |
| JP | 2001-345431 | 12/2001 |
| JP | 2003-229538 | 8/2003 |
| JP | 2004-047791 | 2/2004 |
| JP | 2004-111856 | 4/2004 |
| JP | 2004-128471 A | 4/2004 |
| JP | 2004-513513 | 4/2004 |
| JP | 2005-101594 A | 4/2005 |
| JP | 2005-516421 | 6/2005 |
| WO | WO 01/73845 | 10/2001 |
| WO | WO 02/37500 | 5/2002 |
| WO | WO-03/065473 | 8/2003 |
| WO | WO 2004/015778 | 2/2004 |

OTHER PUBLICATIONS

Written Opinion (Application No. PCT/JP2005/021930) dated Mar. 7, 2006.

Office Action (Application No. 200580040575.5) dated Mar. 20, 2009.

Lemos, "RFID Tags Become Easy Target for Hacker," CNET News.com, Jul. 29, 2004, http://JAPAN.CNET.COM/NEWS/SEC/STORY/0,2000050480,20070122,00.htm.

* cited by examiner

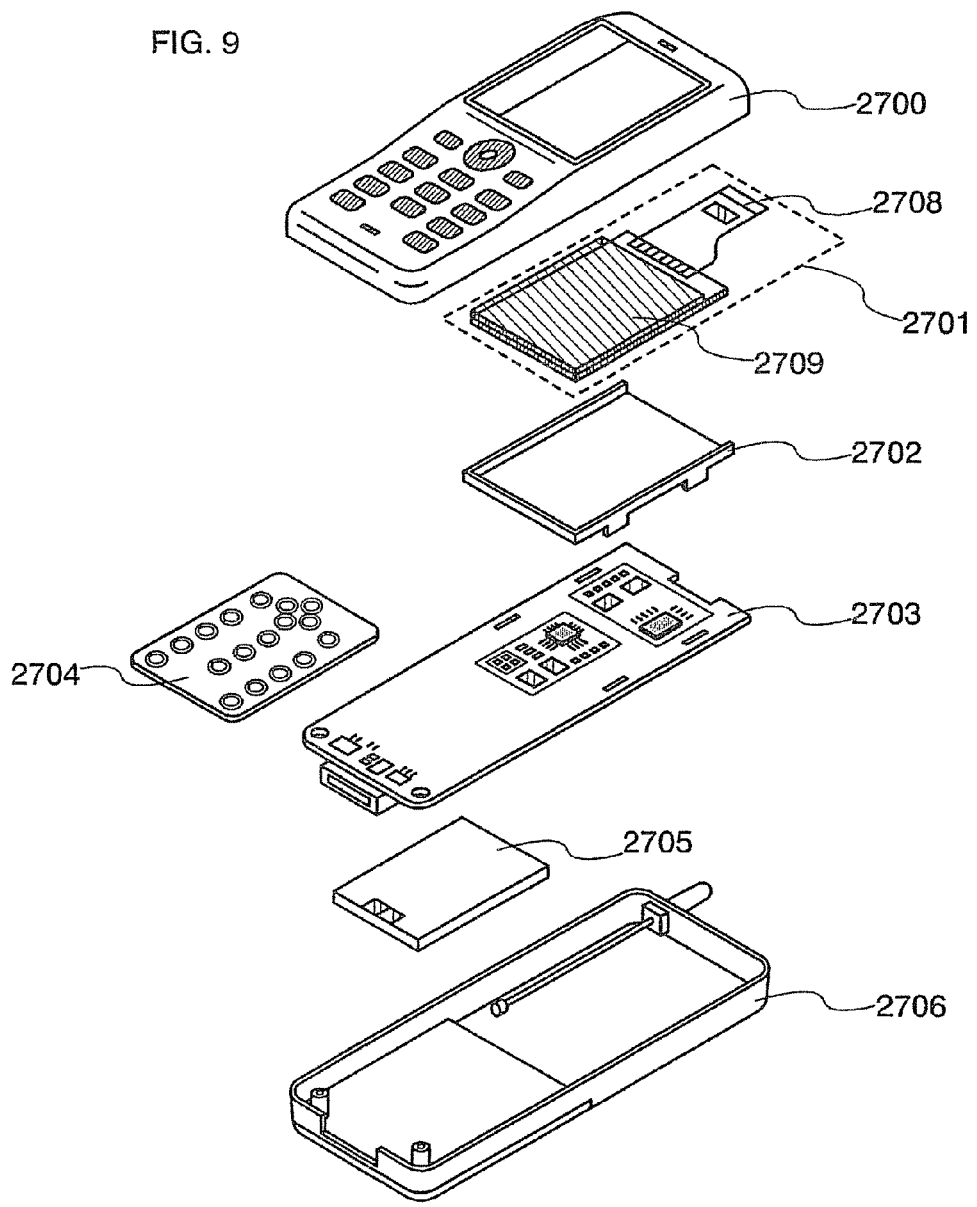

FIG. 10A
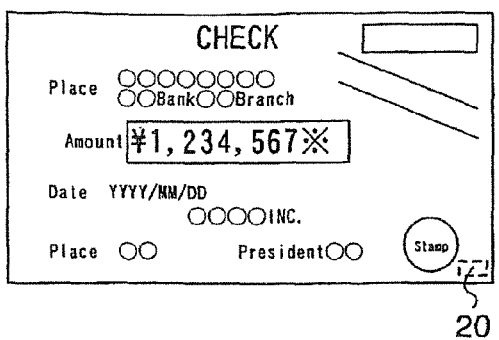
FIG. 10B
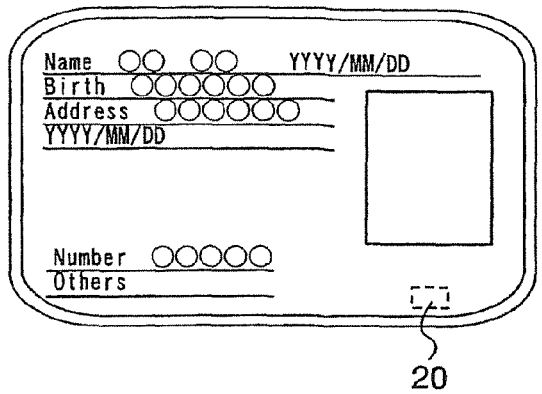
FIG. 10C
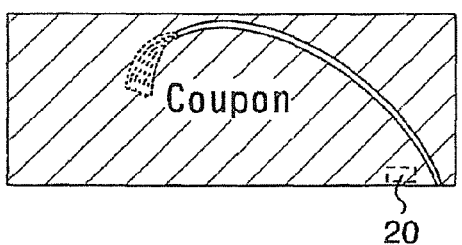
FIG. 10D
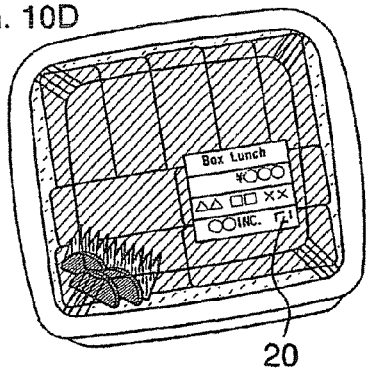
FIG. 10E
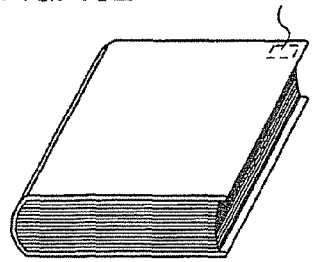
FIG. 10F
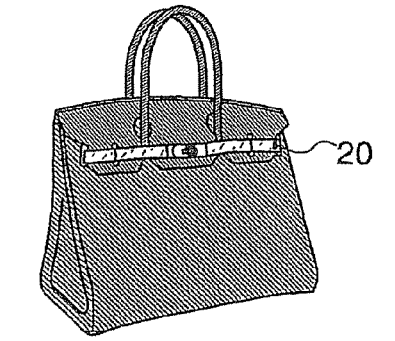
FIG. 10G
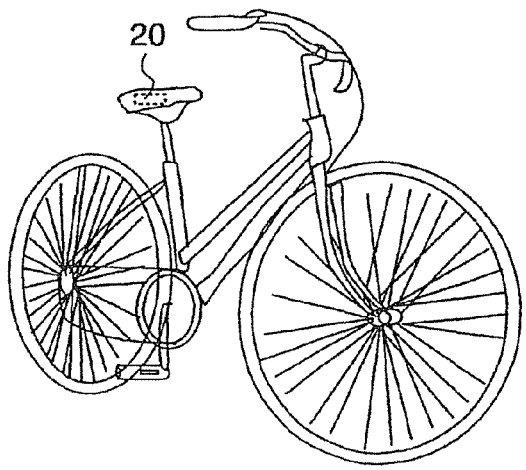
FIG. 10H

SEMICONDUCTOR DEVICE

TECHNICAL FIELD

The present invention relates to a memory circuit including an organic compound and a semiconductor device including such a memory circuit.

BACKGROUND ART

In recent years, individual recognition technology has attracted attention. For example, there is a technology to be used for production and management, in which information such as a history of the object is clarified by giving an ID (an individual recognition code) to an individual object. Above all, the developments of semiconductor devices that can send and receive data without contact have been advanced. As such semiconductor devices, in particular, a wireless chip (also referred to as an ID tag, an IC tag, and IC chip, an RF (Radio Frequency) tag, a wireless tag, an electronic tag, or an RFID (Radio Frequency Identification)) is beginning to be introduced into companies, markets, and the like.

Many of semiconductor devices that have already been put to practical use each have a circuit using a semiconductor substrate such as a Si substrate (also referred to as an IC (Integrated Circuit) chip) and an antenna, and the IC chip includes a memory circuit (also referred to as a memory) and a control circuit. By particularly equipping a memory circuit which can store much data, a high-value-added semiconductor device providing higher performance can be provided. Further, such semiconductor devices are required to be manufactured at low cost. In recent years, organic TFTs or organic memories using organic compounds for the control circuits and memory circuits have been actively developed (Reference 1: Japanese Patent Laid-Open No. 2004-47791).

As a general memory circuit provided in a semiconductor device, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, and the like can be used. Among them, in the case of a DRAM and an SRAM which are volatile memory circuits, data is erased when the power is turned off so that data is required to be written every time the power is turned on. An FeRAM is a nonvolatile memory circuit, which uses a capacitor including a ferroelectric layer and requires a large number of manufacturing process. A mask ROM has a simple structure, however, data is required to be written during the manufacturing steps, and thus data cannot be additionally written. An EPROM, an EEPROM, and a flash memory are non-volatile memory circuits using an element having two gate electrodes, so that the manufacturing steps are increased.

On the other hand, as for a memory circuit using an organic compound, a memory element portion is formed by providing an organic compound between a pair of electrodes, in the case where a thick organic compound layer is formed, current hardly flows and the drive voltage is increased. When a thin organic compound layer is formed instead, the memory circuit is physically damaged easier due to short between electrodes or stress application; consequently, the reliability of the semiconductor device would be reduced.

DISCLOSURE OF INVENTION

In view of the above problems, it is an object of the present invention to provide a nonvolatile organic memory in which data can be written other than during manufacturing and falsification by rewriting can be prevented, and to provide a semiconductor device including such an organic memory. Further, it is another object of the present invention to provide an inexpensive semiconductor device with high reliability.

In order to achieve the objects, the present invention provides the following measures.

A semiconductor device according to the present invention includes a plurality of bit lines extending in a first direction; a plurality of word lines extending in a second direction different from the first direction (for example perpendicular to the first direction); a memory cell array including a plurality of memory cells provided at an intersection of the bit lines and the word lines; and memory elements provided in the memory cells, wherein the memory elements include the bit lines, an organic compound layer, and the word lines, at least the bit lines and the organic compound layer are in contact with each other, the organic compound layer and the word lines are in contact with each other, and the organic compound layer includes a layer in which an inorganic compound and an organic compound are mixed.

A semiconductor device according to the present invention includes a plurality of bit lines extending in a first direction; a plurality of word lines extending in a second direction different from the first direction; a memory cell array including a plurality of memory cells provided at an intersection of the bit lines and the word lines; and memory elements provided in the memory cells, wherein the memory elements include bit lines, an organic compound layer, and the word lines, at least the bit lines and the organic compound layer are in contact with each other, the organic compound layer and the word lines are in contact with each other, and the organic compound layer has a layered structure including a layer in which an inorganic compound and a first organic compound are mixed and a layer containing a second organic compound.

In the above structures, the conductive layer functioning as an antenna may be provided.

In the above structures, the conductive layer functioning as an antenna may be provided in the same layer as the bit lines or the word lines.

In the above structures, the bit lines, the organic compound layer, and the word lines may be stacked.

In the above structures, the bit lines and the word lines may be disposed in one plane, and the organic compound layer may be provided between the bit lines and the word lines.

A semiconductor device according to the present invention includes a plurality of bit lines extending in a first direction; and a plurality of word lines extending in a second direction different from the first direction; a memory cell array including a plurality of memory cells surrounded by the bit lines and the word lines, wherein the memory cells each includes a transistor and a memory element electrically connected to the transistor, the memory element includes a first conductive layer, an organic compound layer, and a second conductive layer, at least the first conductive layer and the organic compound layer are in contact with each other, and the organic compound layer and the second conductive layer are in contact with each other; and the organic compound layer includes a layer in which an inorganic compound and an organic compound are mixed.

A semiconductor device according to the present invention includes a plurality of bit lines extending in a first direction; and a plurality of word lines extending in a second direction different from the first direction; a memory cell array including a plurality of memory cells surrounded by the bit lines and the word lines, wherein the memory cells each includes a transistor and a memory element electrically connected to the transistor, the memory element includes a first conductive layer, an organic compound layer, and a second conductive layer, at least the first conductive layer and the organic compound layer are in contact with each other, and the organic compound layer and the second conductive layer are in contact with each other, and the organic compound layer has a layered structure including a layer in which an inorganic compound and a first organic compound are mixed and a layer containing a second organic compound.

In the above structures, the conductive layer functioning as an antenna may be provided.

In the above structures, the conductive layer functioning as an antenna may be provided in the same layer as the first conductive layer or the second conductive layer.

In the above structures, the first conductive layer, the organic compound layer, and the second conductive layer may be stacked.

In the above structures, the first conductive layer and the second conductive layer may be disposed in one plane, and the organic compound layer may be provided between the first conductive layer and the second conductive layer.

In the above structures, the transistor may be an organic transistor.

In the above structures, the transistor may be provided over a glass substrate or a flexible substrate.

In the above structures, the inorganic compound may be a metal oxide film or a metal nitride film.

In the above structures, the organic compound may be formed of an electron transporting material or a hole transporting material.

A method for manufacturing a semiconductor device according to the present invention includes the steps of forming a plurality of transistors including at least a first transistor and a second transistor over a substrate; forming a first conductive layer electrically connected to the first transistor and a second conductive layer electrically connected to the second transistor; selectively forming an insulating layer so as to cover end portions of the first conductive layer and the second conductive layer; forming a conductive layer functioning as an antenna so as to electrically connect to the first conductive layer; forming an organic compound layer so as to cover the second conductive layer after forming the conductive layer functioning as an antenna; and forming a third conductive layer so as to cover the organic compound layer.

In the above method, the conductive layer functioning as an antenna can be formed by heating a conductive paste which is provided by screen printing or a droplet discharge method.

A method for manufacturing a semiconductor device according to the present invention includes the steps of forming a plurality of transistors including at least a first transistor and a second transistor over a substrate; forming a first conductive layer functioning as an antenna, which is electrically connected to the first transistor, and a second conductive layer electrically connected to the second transistor; selectively forming an insulating layer so as to cover the first conductive layer and an end portion of the second conductive layer; forming an organic compound layer so as to cover the second conductive layer; and forming a third conductive layer so as to cover the organic compound layer.

In the above method, the first conductive layer functioning as an antenna and the second conductive layer can be formed by sputtering or CVD.

In the above methods, the organic compound layer may be formed with a layer in which an inorganic compound and an organic compound are mixed.

Further, as a specific example of a layer provided by mixing an organic compound and an inorganic compound in an organic compound layer, a layer provided by mixing a metal oxide or a metal nitride and an organic compound can be used. Alternatively, the organic compound layer may have a layered structure including a layer provided by mixing a metal oxide or a metal nitride and an organic compound and a layer formed of an organic compound. The organic compound may be an electron transport material or a hole transport material. Any material which can carry carriers can be used instead.

According to the invention, a semiconductor device in which data can be written (written once, read many) other than during manufacturing of a chip and falsification by rewriting can be prevented. Further, a layer can be formed thickly without increase in drive voltage in rewriting or reading of data by adding a layer in which an organic compound and an inorganic compound to an organic compound layer included in a memory element portion. Therefore, a highly reliable semiconductor device can be provided. Moreover, the present invention makes it possible to manufacture a semiconductor device including a memory circuit having a fine structure at low cost.

BRIEF DESCRIPTION OF DRAWINGS

FIG. 9 shows a use of a semiconductor device of the present invention.

FIGS. 10A to 10H each show a use of a semiconductor device of the present invention.

BEST MODE FOR CARRYING OUT THE INVENTION

Figure 1A:
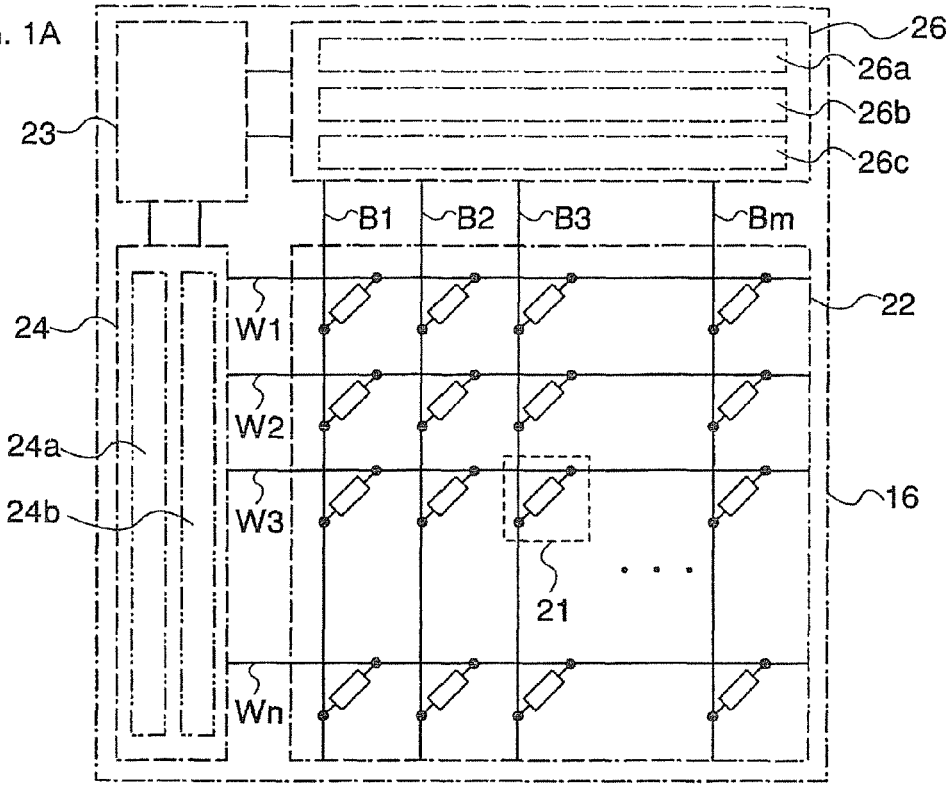
FIGS. 1A to 1C show a semiconductor device according to the resent invention and examples of methods for driving the same.

Embodiment modes and embodiments of the present invention will be described below with reference to the drawings. However, the present invention is not limited to the following descriptions. As is easily understood by a person skilled in the art, the mode and the detail of the invention can be variously changed without departing from the purpose and the scope of the present invention. Accordingly, the present invention is not interpreted as being limited to the following description of the embodiment modes and embodiments. Note that the same reference numeral can be commonly used to denote the same component among the different drawings showing the structures of the present invention described below.

Embodiment Mode 1

In this embodiment mode, a structure of a semiconductor device, particularly, an example of a structure in which a layer containing an organic compound provided between a pair of conductive layers (hereinafter also referred to as an organic compound layer) (the part having the above structure is hereinafter also referred to as an "organic memory element")

FIG. 1A shows an example of a structure of a memory circuit including an organic compound layer (hereinafter referred to as an organic memory). The memory circuit includes a memory cell array 22 in which memory cells 21 each including an organic memory element are arranged in matrix; a bit line driver circuit 26 including a column decoder 26a, a read circuit 26b, and a selector 26c; a word line driver circuit 24 including a row decoder 24a and a level shifter 24b; and an interface 23 having a writing circuit, which communicates with outside. Note that the structure shown here is only an example; accordingly, the memory circuit 16 may include another circuit such as a sense amplifier, an output circuit, and a buffer, and the writing circuit may be provided on the bit line driver circuit.

The memory cell 21 includes an organic memory element having a layered structure including a first conductive layer which forms a bit line Bx ($1 \leq x \leq m$), an organic compound layer, and a second conductive layer which forms a word line Wy ($1 \leq y \leq n$). The organic compound layer may have a single layer structure or a layered structure between the first conductive layer and the second conductive layer.

Figure 2A:
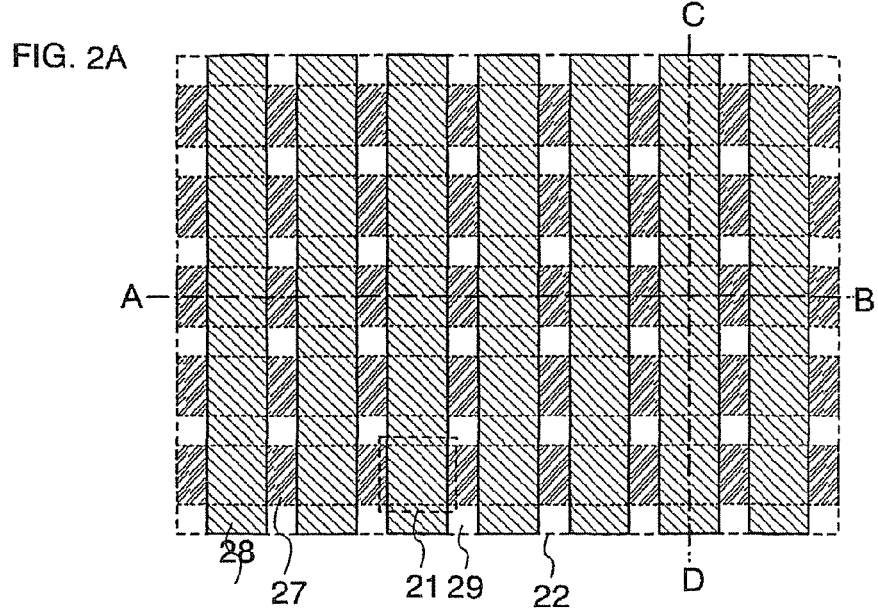
FIGS. 2A to 2E each show a structural example of a semiconductor device of the present invention.
Figure 2B:
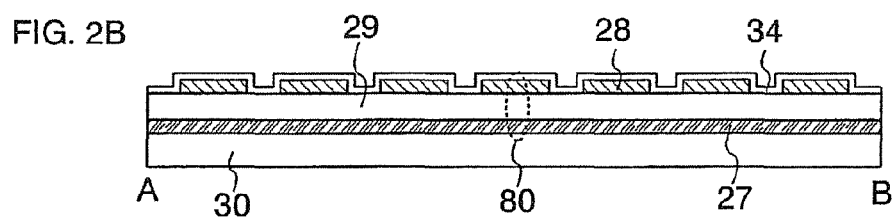
Figure 2C:
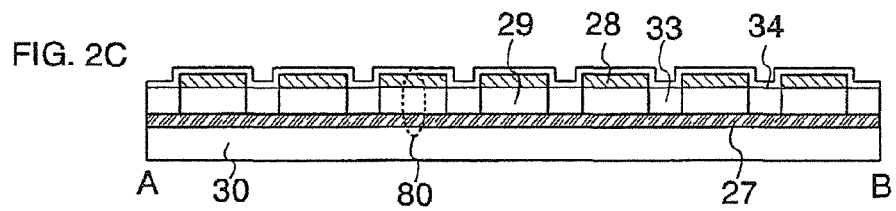
Figure 2D:
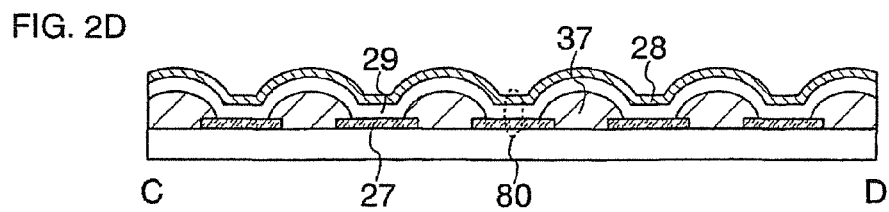

FIGS. 2A to 2E show examples of a planar structure and cross-sectional structures. FIG. 2A shows a planar structure of the memory cell array 22. FIG. 2B shows a cross-sectional structure along line A-B in FIG. 2A. FIG. 2D shows a cross-sectional structure along line C-D in FIG. 2A.

The memory cell array 22 includes, over a substrate 30 having an insulating surface, a first conductive layer 27 which extends in a first direction, an organic compound layer 29 which covers the first conductive layer 27, and a second conductive layer 28 which extends in a second direction that is different from the first direction, for example in the perpendicular direction. Incidentally, the memory cell 21 is provided at an intersection of the first conductive layer 27 and the second conductive layer 28. Further, an organic memory element 80 is formed with a layered structure including the first conductive layer 27, the organic compound layer 29, and the second conductive layer 28. Here, an insulating layer 34 serving as a protective film is provided so as to cover the second conductive layer 28 (FIG. 2B).

If influence of electric field in lateral directions between each adjacent memory cell is feared, in order to isolate an organic compound layer provided in each memory cell, an insulating layer 33 may be provided between each memory cell (FIG. 2C). In other words, organic compound layers may be selectively provided in each pixel.

Further, in providing the organic compound layers 29 covering the first conductive layers 27, insulating layers 37 may be provided between the first conductive layers 27 thereby preventing disconnection of the organic compound layer 29 due to the level differences between the first conductive layers 27 and influence of electric field in lateral directions between each cell (FIG. 2D). Note that the insulating layers 37 are preferably provided in a tapered shape. Thereafter, the organic compound layer 29 is formed to cover the first conductive layers 27 and the insulating layers 37.

In the above structure, a quartz substrate, a silicon substrate, a metal substrate, a stainless-steel substrate, or the like other than a glass substrate and a flexible substrate can be used for the substrate 30. The flexible substrate is a substrate that can be bent flexibly, such as a plastic substrate formed of polycarbonate, polyarylate, polyether sulfone, or the like. Alternatively, the memory cell array 22 can be provided over a field effect transistor (FET) formed over a semiconductor substrate such as a Si substrate, or over a thin film transistor (TFT) formed over a substrate such as a glass substrate.

Further, the first conductive layer 27 and the second conductive layer 28 may have a single layer or a laminated layer containing an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), and titanium (Ti), tantalum (Ta) or an alloy containing a plurality of the elements. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used.

The first conductive layer 27 and the second conductive layer 28 can be formed by vapor deposition, sputtering, CVD, printing, or a droplet discharge method. Here, the first conductive layer 27 and the second conductive layer 28 can be formed using any of the methods above. Alternatively, the first conductive layer 27 and the second conductive layer 28 may be formed by another method. Incidentally, the droplet discharge method is a method by which a droplet (also referred to as a dot) of a composite containing a conductive, insulative, or semiconducting material is selectively discharged (sprayed) to form a conductor, an insulator, or a semiconductor at an arbitrary position. The droplet discharge method includes an ink-jet method.

In this embodiment mode, writing of data into an organic memory is conducted by electrical action or optical action. In the case of writing data by optical action, one or both of the first conductive layer 27 and the second conductive layer 28 is provided so as to transmit light. A light-transmitting conductive layer is formed using a transparent conductive material. Alternatively, the light-transmitting conductive layer may be formed with a thin thickness so that light can pass therethrough. As the transparent conductive material, indium tin oxide (ITO), zinc oxide (ZnO), indium zinc oxide (IZO), zinc oxide added with gallium (GZO), and other light-transmitting oxide conductive materials can be used. Indium tin oxide containing ITO and silicon oxide, or a material in which 2 to 20% of zinc oxide (ZnO) is mixed into indium oxide containing silicon oxide may be used instead.

The organic compound layer 29 includes a layer in which an organic compound and an inorganic compound are mixed. The organic compound layer 29 may be a single layer of a mixed layer of an organic compound and an inorganic compound or may have a layered structure of a plurality of layers. Further, a mixed layer of an organic compound and an inorganic compound, and another layer formed of an organic compound may be stacked together. In this case, the organic compound material contained in the mixed layer may be the same as or different from the organic compound material contained in the other layer formed of an organic compound.

Any inorganic compound material which easily accepts electrons from an organic compound or easily donates electrons to an organic compound is used for the inorganic compound, and various metal oxides, metal nitrides, or metal oxynitrides can be used.

As the inorganic compound material which easily accepts electrons; a metal oxide, a metal nitride, or a metal oxynitride of a transition metal that belongs to any one of Groups 4 to 12 of the periodic table can be used. Specifically, a metal oxide of titanium oxide (TiOx), zirconium oxide (ZrOx), vanadium oxide (VOx), molybdenum oxide (MoOx), tungsten oxide (WOx), tantalum oxide (TaOx), hafnium oxide (HfOx), niobium oxide (NbOx), cobalt oxide (Cox), rhenium oxide (ReOx), ruthenium oxide (RuOx), zinc oxide (ZnO), nickel oxide (NiOx), or copper oxide (CuOx) can be used. Oxides are taken as examples here; however, a nitride or an oxynitride of the element can naturally be used instead.

As the inorganic compound material which easily donates electrons; an alkali metal oxide, an alkaline-earth metal oxide, a rare-earth metal oxide, an alkali metal nitride, an alkaline-earth metal nitride, or a rare-earth metal nitride can be used. Specifically, lithium oxide (LiOx), strontium oxide (SrOx), barium oxide (BaOx), erbium oxide (ErOx), sodium oxide (NaOx), lithium nitride (LiNx), magnesium nitride (MgNx), calcium nitride (CaNx), yttrium nitride (YNx), or lanthanum nitride (LaNx), or the like can be used.

Other than the above materials, aluminum oxide (AlOx), gallium oxide (GaOx), silicon oxide (SiOx), germanium oxide (GeOx), indium tin oxide (ITO), or the like may be used as the inorganic compound.

As the organic compound, it is preferable to use an organic compound material which has a high hole-transport property or a high electron-transport property.

As a highly hole-transporting organic compound material, an aromatic amine compound (in other words, a compound having a benzene ring-nitrogen bond) such as 4,4'-bis[N-(1-naphthyl)-N-phenyl-amino]-biphenyl (abbr.: α-NPD), 4,4'-bis[N-(3-methylphenyl)-N-phenyl-amino]-biphenyl (abbr.: TPD), 4,4',4''-tris(N,N-diphenyl-amino)-triphenylamine (abbr.: TDATA), 4,4',4''-tris[N-(3-methylphenyl)-N-phenyl-amino]-triphenylamine (abbr.: MTDATA), or 4,4'-bis(N-(4-(N,N-di-m-tolylamino)phenyl)-N-phenylamino)biphenyl (abbr.: DNTPD); or a phthalocyanine compound such as phthalocyanine (abbr.: $H_2Pc$), copper phthalocyanine (abbr.: CuPc), or vanadyl phthalocyanine (abbr.: VOPc) can be used. The materials described here are mainly materials having a hole mobility of $10^{-6}$ cm$^2$/Vs or more. However, a material other than the above-described materials may be used as long as it has a higher hole-transport property than the electron-transport property. Note that, in the case of providing a mixed layer of an organic compound and an inorganic compound, it is preferable to mix a highly hole-transporting organic material and a highly electron-accepting inorganic material. With such a structure, many hole carriers are generated in the organic compound which has few carriers; thus, an extremely excellent hole injection/transport property is provided. As a result, the organic compound layer can have excellent conductivity.

As the highly-electron transporting organic compound material, a material formed of a metal complex having a quinoline skeleton or a benzoquinoline skeleton such as tris (8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), or bis(2-methyl-8-quinolinolato)-4-phenylphenolato-aluminum (abbr.: BAlq), or the like can be used. Alternatively, a material of a metal complex having an oxazole or thiazole ligand such as bis[2-(2-hydroxyphenyl)benzoxazolate]zinc (abbr.: Zn(BOX)$_2$) or bis[2-(2-hydroxyphenyl)benzothiazolate]zinc (abbr.: Zn(BTZ)$_2$), or the like can be used. In addition to the metal complex, 2-(4-biphenylyl)-5-(4-tert-butylphenyl)-1,3,4-oxadiazole (abbr.: PBD); 1,3-bis[5-(p-tert-butylphenyl)-1,3,4-oxadiazole-2-yl]benzene (abbr.: OXD-7); 3-(4-tert-butylphenyl)-4-phenyl-5-(4-biphenylyl)-1,2,4-triazole (abbr.: TAZ); 3-(4-tert-butylphenyl)-4-(4-ethylphenyl)-5-(4-biphenylyl)-1,2,4-triazole (abbr.: p-EtTAZ); bathophenanthroline (abbr.: BPhen); bathocuproin (abbr.: BCP); or the like can be used. The materials described here are mainly materials having an electron mobility of $10^{-6}$ cm$^2$/Vs or more. However, a material other than the above-described materials may be used as long as it has a higher electron-transport property than the hole-transport property. Note that, in the case of providing a mixed layer of an organic compound and an inorganic compound, it is preferable to mix a highly electron-transporting organic material and a highly electron-donating inorganic material. With such a structure, many electron carriers are generated in the organic compound which has few carriers; thus, an extremely excellent electron injection/transport property is provided. As a result, the organic compound layer can have excellent conductivity.

Further, in the case where the organic compound layer 29 is formed from a highly hole-transporting material and a compound selected from metal oxides or metal nitrides, a compound having large steric hindrance (having not a planar structure but a spatial structure) may be added. As the compound having large steric hindrance, 5,6,11,12-tetraphenyltetracene (abbr.: rubrene) is preferable. Alternatively, hexaphenylbenzene, t-butylperylene, 9,10-di(phenyl)anthracene, coumarin 545T, or the like can be used. Further, a dendrimer or the like is also effective.

In the case where the organic compound layer 29 is formed from a highly electron-transporting material and a compound selected from metal oxides or metal nitrides, as the electron donating material which can further donate electrons to the electron-transporting material, alkali metal such as lithium (Li) or cesium (Cs), alkaline earth metal such as magnesium (Mg), calcium (Ca), or strontium (Sr), rare-earth metal such as erbium or ytterbium, a compound such as oxide or halide thereof, or the like may be added.

The organic compound layer 29 can be formed by vapor deposition, electron beam evaporation, sputtering, or the like. Further, the mixed layer containing an organic compound and an inorganic compound can be formed by depositing each material concurrently. For example, the mixed layer can be formed by combining the same or different methods such as coevaporation by resistance heating evaporation, coevaporation by electron beam evaporation, coevaporation by resistance heating and electron beam evaporation, deposition by resistance heating and sputtering, or deposition by electron beam evaporation and sputtering. Further, a layer containing three or more kinds of materials can also be formed by similarly combining the methods.

As another method, spin coating, a sol-gel process, a printing method, a droplet discharge method, or a combination thereof with the above-described method may be used to form the organic compound layer 29. In the case where the organic compound layer 29 is formed with a plurality of layers, for example, with a layered structure of a mixed layer containing an organic compound and an inorganic compound, and a layer containing an organic compound, different methods may be used to form each layer.

Thus, by providing a mixed layer containing an organic compound and an inorganic compound, increase in resistance can be suppressed even in the case of increasing the thickness of the organic compound layer 29. Accordingly, distance between the conductive layers can be made large by forming a thick organic compound layer sandwiched between the conductive layers without increase in the drive voltage in writing or reading data. Consequently, short circuit between conductive layers or damage to a memory cell due to external force in an organic memory element; thus, the reliability of a semiconductor device including the organic memory can be improved.

Figure 2E:
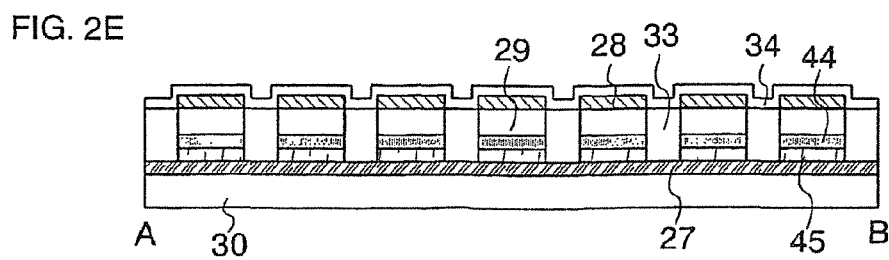

As a structure different from the above structure, a rectifying element may be provided between the first conductive layer 27 and the organic compound layer 29 or between the second conductive layer 28 and the organic compound layer 29 (FIG. 2E). The rectifying element typically refers to a Schottky diode, a diode having a PN junction, a diode having a PIN junction, or a transistor in which a gate electrode and a drain electrode are connected. Naturally, the rectifying element may be a diode having another structure. Here, a PN junction diode including semiconductor layers 44 and 45 between the first conductive layer and the organic compound layer is provided. One of the semiconductor layers 44 and 45 is an N-type semiconductor while the other is a P-type semiconductor. Thus, selectivity of a memory cell and margin of reading and writing can be improved by providing the rectifying element.

Figure 19A:
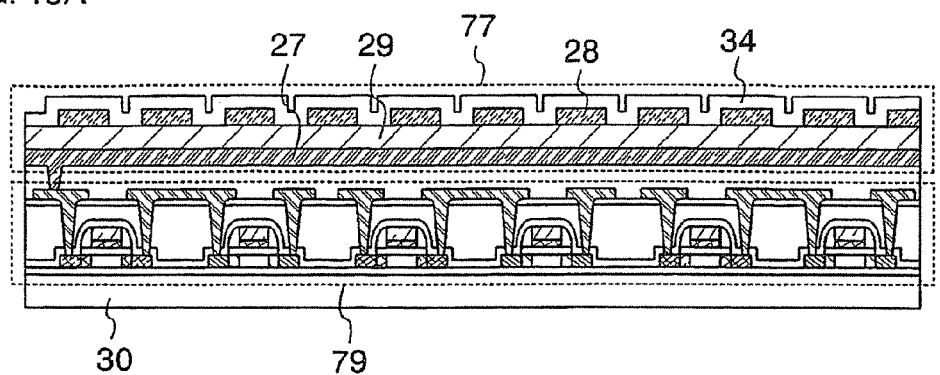
FIGS. 19A and 19B each show a structural example of a semiconductor device of the present invention.
Figure 19B:
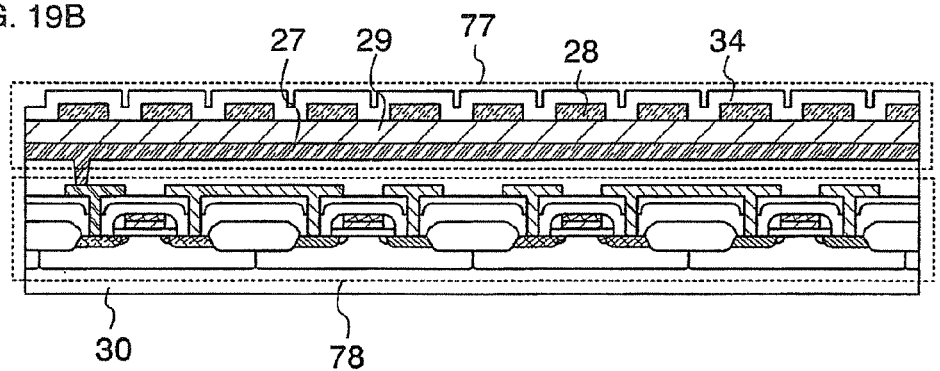

Further, an example of providing a memory element including a plurality of organic memory elements over the substrate 30 is shown in FIGS. 2A to 2E. However, it is not limited thereto, and a memory element portion 77 having a plurality of organic memory elements may be provided over thin film transistors (TFT) 79 provided over a substrate 30 (FIG. 19A), or the memory element portion 77 may be provided over filed effect transistors (FET) 78 formed over the substrate 30, which is a semiconductor substrate such as a Si substrate, or an SOI substrate. Examples of forming the memory element portion 77 over the thin film transistors 79 or the field effect transistors 78 are shown; however, the memory element portion 77 and the thin film transistors 79 or the memory element portion 77 and the field effect transistors 78 may be attached to each other. In this case, the memory element portion 77 and the thin film transistors 79 or the memory element portion 77 and the field effect transistors 78 may be manufactured in separate processes and may be adhered to each other using a conductive film, or the like. Further, the thin film transistors 79 or the field effect transistors may have any known structure.

Next, operation of writing data into the organic memory will be explained. Data is written by optical action or electric action. First, the case of writing data by electric action will be explained (FIG. 1A). Writing is conducted by changing electric characteristics of a memory cell, and an initial state (state without electric action) of the memory cell is used as data "0" and a state of changing electric characteristics is used as data "1" in this embodiment mode.

In the case of writing data "1" into the memory cell 21, the memory cell 21 is selected first by a row decoder 24a, a column decoder 26a, and a selector 26c through an interface 23. Concretely, a predetermined voltage V2 is applied to a word line W3 connected to the memory cell 21 by the row decoder 24a. A bit line B3 connected to the memory cell 21 is connected to a read circuit 26b by the column decoder 26a and the selector 26c. Then, a write voltage V1 is outputted from the read circuit 26b to the bit line B3. Thus, an electric potential Vw=V1−V2 is applied between the first conductive layer and a second conductive layer included in the memory cell 21. By selecting an appropriate electric potential Vw, the organic compound layer 29 provided between the conductive layers is changed physically or electrically to write data "1". Concretely, at a reading operation voltage, electric resistance between the first conductive layer and second conductive layer in the state of data "1" may be changed so as to be drastically lowered compared with the electric resistance in the state of data "0". For example, the voltage may be appropriately selected from the range of (V1, V2)=(0 V, 5 V to 15 V) or (3 V to 5 V, −12 V to −2 V). The electric potential Vw may be 5V to 15V or −5V to −15V. In this case, the distance between the pair of conductive layers provided so as to interpose the organic compound layer changes in some cases.

A non-selected word line and a non-selected bit line are controlled so that data "1" is not written into the memory cell which is to be connected to the non-selected word line and the non-selected bit line. For example, the non-selected word line and the non-selected bit line may be in a floating state. Characteristics which can ensure selectivity such as diode characteristics are required between the first conductive layer and second conductive layer included in the memory cell.

On the other hand, in the case of writing data "0" into the memory cell 21, all that is required is that electric action is not applied to the memory cell 21. In circuit operation, for example, although the memory cell 21 is selected by the row decoder 24a, the column decoder 26a, and the selector 26c in the same way as the case of writing data "1". Meanwhile, the output electric potential from the read circuit 26b to the bit line B3 may be set to be equivalent to an electric potential of a selected word line W3 or an electric potential of a non-selected word line, and such a voltage (for example, −5 V to 5 V) that does not change the electric characteristics of the memory cell 21 may be applied between the first conductive layer and second conductive layer included in the memory cell 21.

Figures 1, 3A:
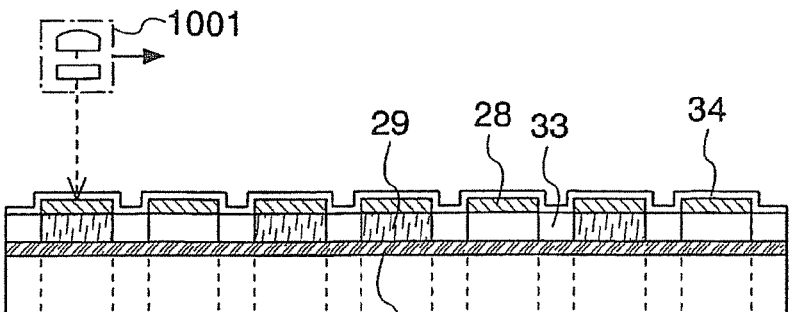
FIGS. 3A and 3B each show an example of writing data into a semiconductor device of the present invention with the use of a laser.
Figures 2, 3A:
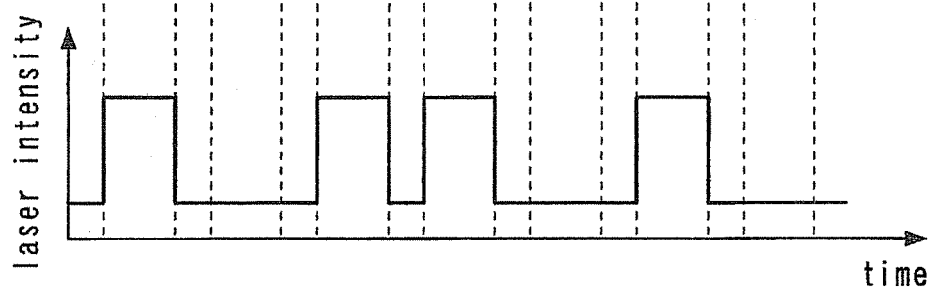
Figure 3B:
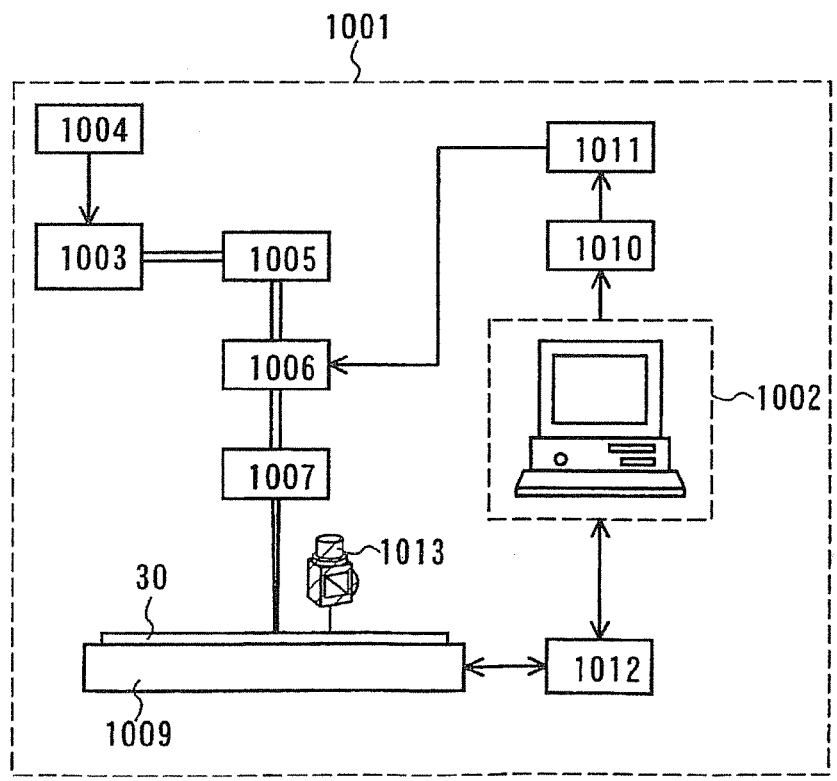

Next, the case of writing data by optical action will be explained (FIGS. 3A and 3B).

As shown in FIG. 3A, in this case of writing data by applying optical action, an organic compound layer 29 included in an organic memory element is irradiated with laser light from a conductive layer side where the conductive layer has a light-transmitting property (second conductive layer 28 here). Here, the organic compound layer 29 included in an organic memory element in a desired portion is selectively irradiated with laser light to destroy the organic compound layer 29. The destroyed organic compound layer is carbonized and insulated; therefore, the resistance between the first conductive layer and the second conductive layer is significantly increased compared with the resistance of another organic memory element which has not been destroyed. Data is written by utilizing the phenomenon that electric resistance between two conductive layers provided so as to interpose the organic compound layer 29 is changed by laser light irradiation. For example, in the case where an organic memory element including an organic compound layer which is not irradiated with laser light is used for "0", an organic compound layer included in an organic memory element in a desired portion is selectively irradiated with laser light and destroyed to heighten the electric resistance in the case of writing data "1".

In the case of laser light irradiation, the change of electric resistance of an organic memory element depends on the size of the memory cell 21; however, the change is realized by irradiation with laser light focused to a diameter of micrometer size or nanometer size. For example, when a laser beam having a diameter of 1 μm passes at a linear velocity of 10 m/sec, the period of irradiating the organic memory element included in one memory cell 21 with laser light is 100 nsec. In order to change the phase within time as short as 100 nsec, the laser power is preferably 10 mW and the power density is preferably 10 kW/mm$^2$. When the organic memory element is selectively irradiated with laser light, it is preferable to use a pulsed laser irradiation apparatus.

Here, an example of a laser irradiation apparatus will be explained with reference to FIG. 3B. A laser irradiation apparatus 1001 is provided with a personal computer 1002 (hereinafter, referred to as PC 1002) for conducting various controls when laser light is emitted; a laser oscillator 1003 for emitting laser light; a power supply 1004 of the laser oscillator 1003; an optical system (ND filter) 1005 for attenuating the laser light; an Acousto-Optic Modulator (AOM) 1006 for modulating the intensity of the laser light; an optical system 1007 including a lens for reducing the area of the cross section of the laser light, a mirror for changing a light path, and the like; a transfer mechanism 1009 having an X axis stage and a Y axis stage; a D/A converter 1010 for converting control data outputted from the PC from a digital one to an analog one; a driver 1011 for controlling the Acousto-Optic Modulator 1006 in accordance with the analog voltage outputted from the D/A converter; a driver 1012 for outputting a driving signal for driving the transfer mechanism 1009; and an auto-focusing mechanism 1013 for focusing laser light on an object to be irradiated.

A laser oscillator which can emit ultraviolet light, visible light, or infrared light can be used as the laser oscillator 1003. An excimer laser oscillator using KrF, ArF, XeCl, Xe, or the like; a gas laser oscillator using He, He—Cd, Ar, He—Ne, HF, or the like; a solid-state laser oscillator using a crystal such as YAG, GdVO$_4$, YVO$_4$, YLF, or YAlO$_3$ doped with Cr, Nd, Er, Ho, Ce, Co, Ti, or Tm; or a semiconductor laser oscillator using GaN, GaAs, GaAlAs, InGaAsP, or the like can be used as the laser oscillator. Note that a fundamental wave or a second harmonic to a fifth harmonic is preferably applied to a solid-state laser oscillator.

Next, an irradiation method using the laser irradiation apparatus will be described with reference to FIG. 3A. When a substrate 30 provided with an organic compound layer 29 is set on the transfer mechanism 1009, the PC 1002 detects a position of the organic compound layer 29 which is to be irradiated with laser light by a camera which is not shown in the figures. Then, the PC 1002 generates movement data for moving the transfer mechanism 1009 based on the detected position data.

Thereafter, the PC 1002 controls the amount of light which is to be emitted from the Acousto-Optic Modulator 1006 through the driver 1011; thus, laser light emitted from the laser oscillator 1003 is attenuated by the optical system 1005. Then, the amount of light is controlled by the Acousto-Optic Modulator 1006 so as to obtain a predetermined amount of light. Meanwhile, the light path and the shape of a beam spot of the laser light outputted from the Acousto-Optic Modulator 1006 are changed with the optical system 1007 and the laser light is collected by the lens. Then, the substrate is irradiated with the laser light.

At this time, the transfer mechanism 1009 is controlled to move in an X direction and a Y direction in accordance with the movement data generated by the PC 1002. As a result, a predetermined position is irradiated with the laser light, and the light energy density of the laser light is converted to heat energy. Thus, the organic compound layer provided over the substrate 30 can be selectively irradiated with laser light. It is to be noted that laser light irradiation is conducted by moving the transfer mechanism 1009; however, laser light may be moved to an X direction and a Y direction by adjusting the optical system 1007.

Figure 1B:
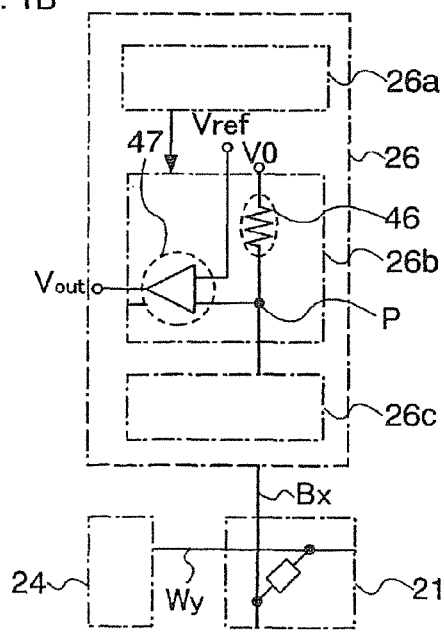
Figure 1C:
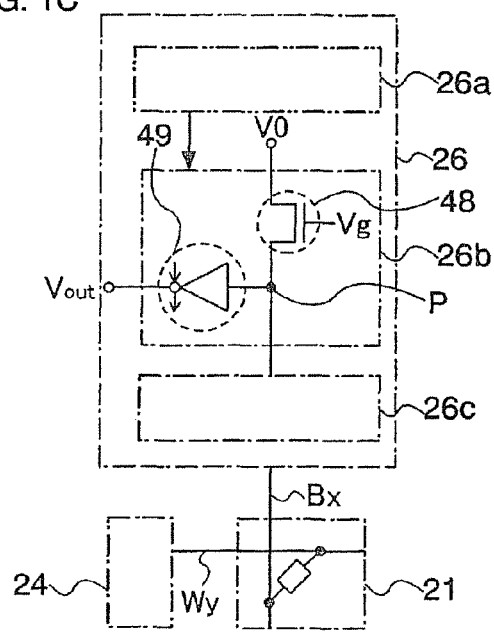

Subsequently, the operation of reading data from an organic memory is explained (FIGS. 1A to 1C). Reading data is carried out by using electronic characteristics between a first conductive layer and a second conductive layer included in a memory cell, which are different between a memory cell having data "0" and a memory cell having data "1". For example, a reading method utilizing the difference in electric resistance will be explained, where the effective electric resistance between a first conductive layer and a second conductive layer included in a memory cell (herein after also simply referred to as electric resistance of memory cell) with data "0" is R0 at a reading voltage, and the electric resistance of a memory cell with data "1" is R1 at a reading voltage (R1<<R0). As for a read circuit 26b, for example, a circuit using a resistor 46 and a differential amplifier 47 shown in FIG. 1B can be conceivable as a structure of its reading portion. The resistor 46 has a resistance value Rr (R1<Rr<R0). A transistor 48 may be used instead of the resistor 46 and a clocked inverter 49 can be used instead of the differential amplifier (FIG. 1C). A signal or an inverted signal which is Hi when reading is conducted and Lo when reading is not conducted is inputted into the clocked inverter 49. Naturally, the circuit configuration is not limited to FIGS. 1B and 1C.

In the case of reading data from the memory cell 21, the memory cell 21 is selected first by the row decoder 24a, the column decoder 26a, and the selector 26c through an interface 23. Concretely, a predetermined voltage Vy is applied to a word line Wy connected to the memory cell 21 by the row decoder 24a. A bit line Bx connected to the memory cell 21 is connected to a terminal P of the read circuit 26b by the column decoder 26a and the selector 26c. Accordingly, the electric potential Vp of the terminal P is a value determined by dividing Vy and V0 by the resistor 46 (resistance value: Rr) and the memory cell 21 (resistance value: R0 or R1). Therefore, the equation Vp0=Vy+(V0−Vy)*R0/(R0+Rr) holds in the case where the memory cell 21 has data "0". Alternatively, the equation Vp1=Vy+(V0−Vy)*R1/(R1+Rr) holds in the case where the memory cell 21 has data "1". As a result, by selecting Vref so as to be between Vp0 and Vp1 in FIG. 1B or by selecting the change point of the clocked inverter between Vp0 and Vp1 in FIG. 1C, output electric potential Vout of Lo/Hi (or Hi/Lo) is outputted in accordance with data "0"/ "1", so that reading can be conducted.

For example, assume that the differential amplifier is operated at Vdd=3 V, and Vy, V0, and Vref are 0 V, 3 V, and 1.5 V, respectively. On the condition of R0/Rr=Rr/R1=9, Hi is outputted as Vout in accordance with Vp0=2.7 V when the memory cell has data "0", or Lo is outputted as Vout in accordance with Vp1=0.3 V when a memory cell has data "1". In this way, reading of a memory cell can be conducted.

According to the above method, the state of electric resistance of an organic memory element is read in a voltage value utilizing the difference in resistance values and resistance division. Naturally, the reading method is not limited thereto. For example, reading may be conducted utilizing the difference in current values other than utilizing the difference in electric resistance. In the case where electric characteristics of the memory cell have different diode characteristics between threshold voltages in the case of data "0" and data "1", reading may be conducted utilizing the difference in threshold voltage.

As described above, an organic memory shown in this embodiment mode has a simple structure in which an organic compound layer is provided between a pair of conductive layers; therefore, a manufacturing process thereof is simple and an inexpensive semiconductor device can be provided. Further, the organic memory according shown in this embodiment mode is a nonvolatile memory; therefore, an electric battery for storing data is not required to be incorporated, and a small-sized, thin, and lightweight semiconductor device can be provided. Further, by using irreversible materials for the organic compound layer 29, data cannot be rewritten though data can be written (additionally). Accordingly, counterfeits can be prevented and a semiconductor device with ensured security can be provided by using the organic memory.

Embodiment Mode 2

In this embodiment mode, a semiconductor device having a structure different from Embodiment Mode 1 will be described. Specifically, the case where the memory circuit has an active matrix structure will be shown.

Figure 4A:
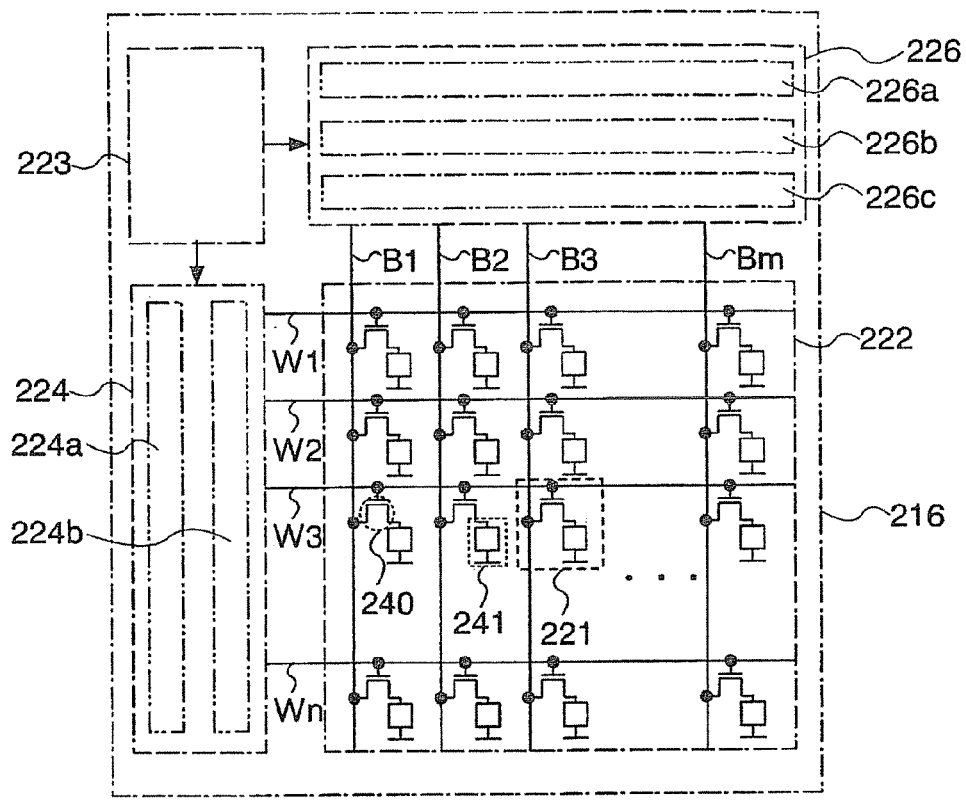
FIGS. 4A to 4C show a semiconductor device according to the present invention and examples of methods for driving the same.

FIG. 4A shows an example of a structure of an organic memory of this embodiment mode. The memory circuit includes a memory cell array 222 in which memory cells 221 are arranged in matrix; a bit line driver circuit 226 including a column decoder 226a, a read circuit 226b, and a selector 226c; a word line driver circuit 224 including a row decoder 224a and a level shifter 224b; and an interface 223 haying a writing circuit, which communicates with outside. Note that the structure shown here is only an example; accordingly, the memory circuit 216 may include another circuit such as a sense amplifier, an output circuit, and a buffer, and the writing circuit may be provided on the bit line driver circuit.

The memory cell 221 includes a first wiring constituting a bit line Bx ($1 \leq x \leq m$), a second wiring constituting a word line Wy ($1 \leq y \leq n$), a transistor 240, and a memory element 241. Further, the memory element 241 has a structure in which an organic compound layer is interposed between a pair of conductive layers.

Figure 5A:
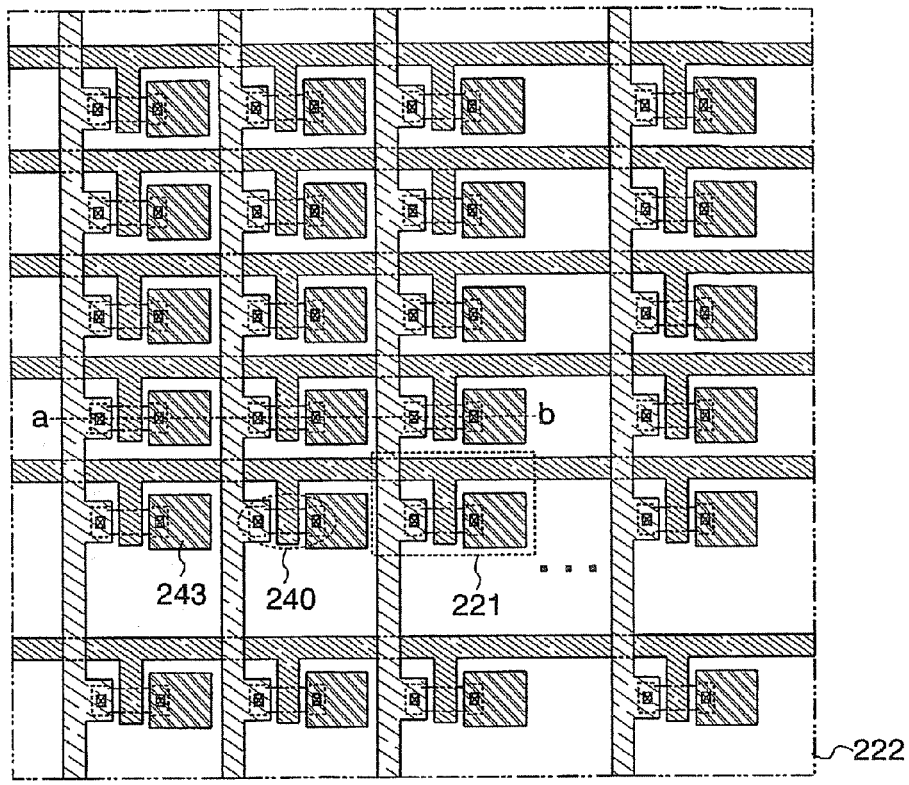
FIGS. 5A to 5C each show a structural example of a semiconductor device of the present invention.
Figure 5B:
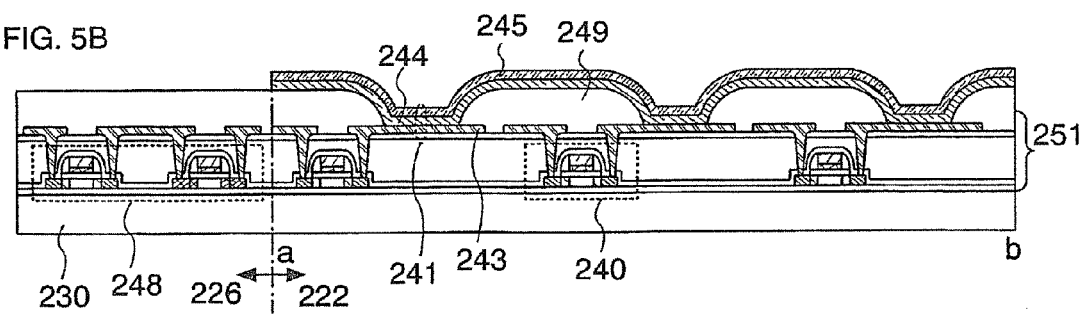

Next, an example of a top view and cross-sectional views of the memory cell array 222 having the above structure will be explained with reference to FIGS. 5A to 5C. Incidentally, FIG. 5A shows an example of the top view. FIG. 5B shows a cross-sectional structure along line a-b in FIG. 5A and the cross-sectional structure of a CMOS circuit included in the bit line driver circuit 226.

The memory cell array 222 includes a plurality of a transistors 240 functioning as a switching element and a plurality of memory elements 241 (hereinafter also referred to as organic memory elements 241) each connected to one of the transistors 240 over a substrate 230 having an insulating surface (FIGS. 5A and 5B). The memory elements 241 each include a first conductive layer 243, a second conductive layer 245, and an organic compound layer 244, and the organic compound layer 244 is sandwiched between the first conductive layers 243 and the second conductive layer 245. Here, insulating layers 249 are provided between each adjacent memory cell 221, and an organic compound layer 244 and a second conductive layer 245 are provided in stack over the first conductive layer and the insulating layers 249 (FIG. 5B).

Figure 5C:
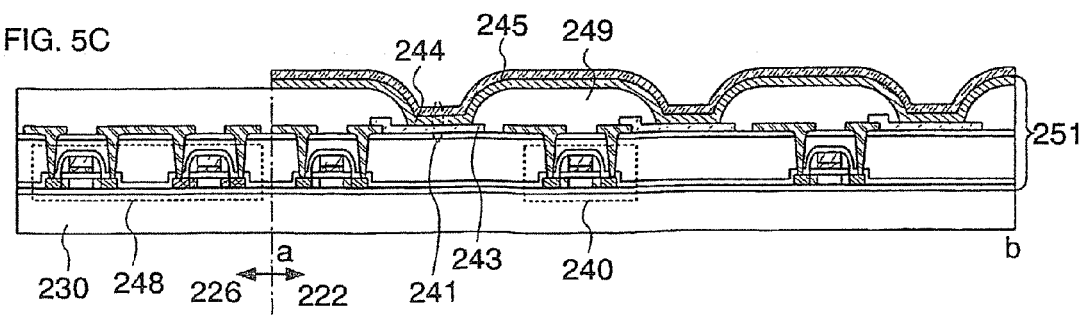

Further, in FIG. 5B, the first conductive layers 243 also functions as a source or drain electrode of each transistor 240 provided in an element formation layer 251; however, the first conductive layers 243 may be formed separately from a source or drain electrode (FIG. 5C). This structure is effective in the case of forming a source and drain electrodes and the first conductive layers 243 with different materials, for example, in the case of providing the first conductive layers 243 with a light-transmitting material such as ITO. Note that in the above structure, the organic compound layer 244 is formed over the entire surface; however, the organic compound layer 244 may be selectively provided only over each memory cell. In this case, for example, efficiency in the use of materials can be improved by selectively providing the organic compound layer 244 using a droplet discharge method, gravure printing, screen printing, or the like.

Figure 11A:
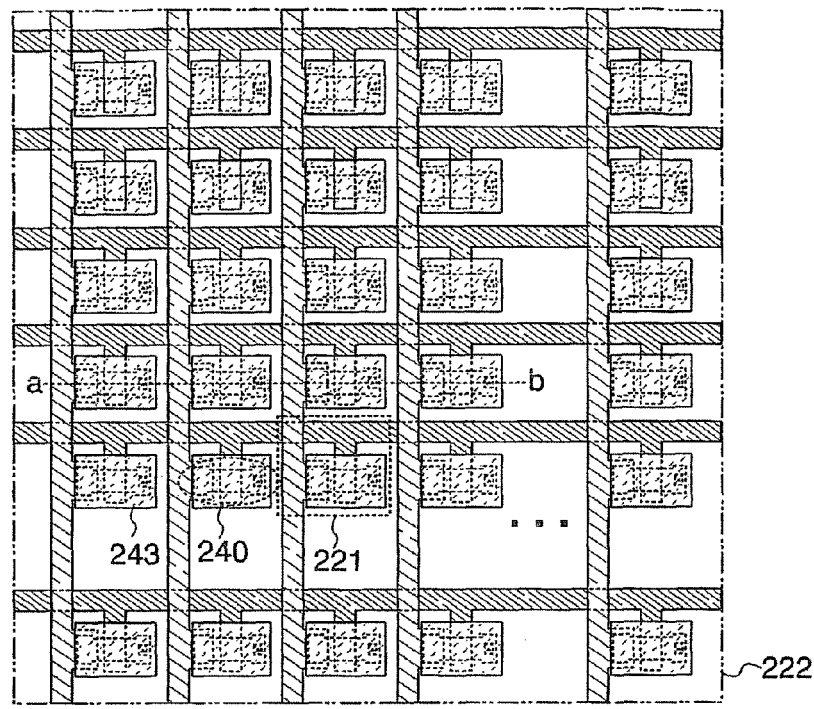
FIGS. 11A to 11C each show a structural example of a semiconductor device of the present invention.
Figure 11B:
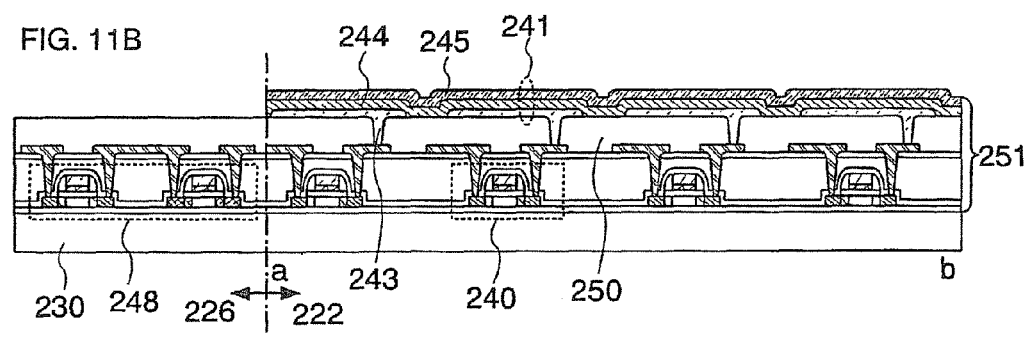
Figure 11C:
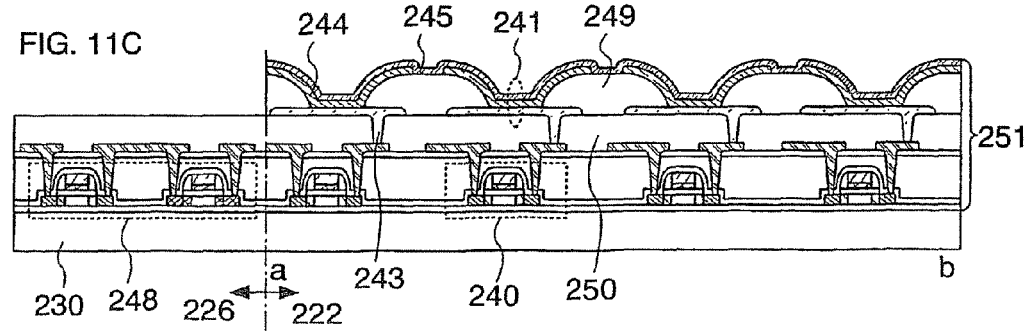

Further, insulating layers 250 are provided as protective films so as to cover a source electrode and a drain electrode of each transistor 240, and first conductive layers 243 can be provided over the insulating layers 250 (FIGS. 11A to 11C). In this case, the organic compound layer 244 may be formed over the entire surface to cover the first conductive layers 243 (FIG. 11B). Further, disconnection of the organic compound layer 244 or influence of electric field in lateral directions between each adjacent memory cell is feared, insulating layers 249 may be provided to isolate the organic compound layer in an organic memory element provided in each memory cell (FIG. 11C). In addition, in FIG. 11C, organic compound layers 244 are provided selectively in each memory cell; however, the organic compound layer 244 may be provided over the entire surface as shown in FIG. 5C.

In such a structure, where the insulating layers 250 are provided to form memory element portions, the first conductive layer can be provided freely. In the structure of FIGS. 5A to 5C, the memory elements 241 are necessarily provided in a region except the source electrode or the drain electrode of each transistor 240; however, with the above structure, for example, the memory elements 241 can be formed above the transistors 240 provided in the element formation layer 251. Consequently, higher integration of a memory circuit 216 can be achieved (FIG. 11A).

Further, as a structure different from the above structure, a first conductive layer and a second conductive layer may be arranged in the same layer to form a memory element portion. An example of the structure in this case will be explained with reference to FIGS. 20A to 20C.

Figure 20A:
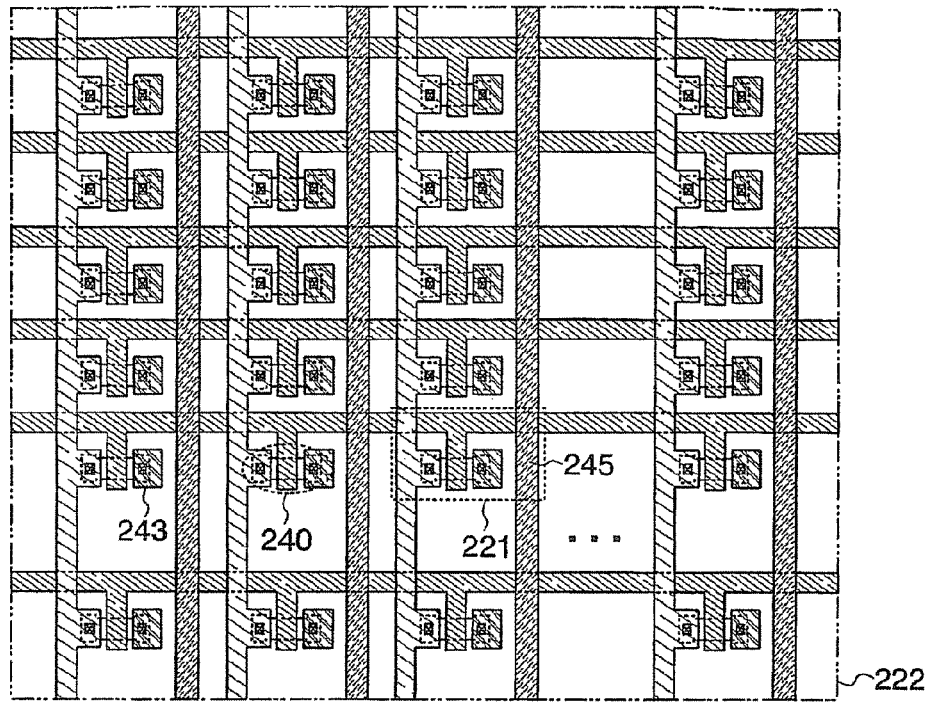
FIGS. 20A to 20C each show a structural example of a semiconductor device of the present invention.
Figure 20B:
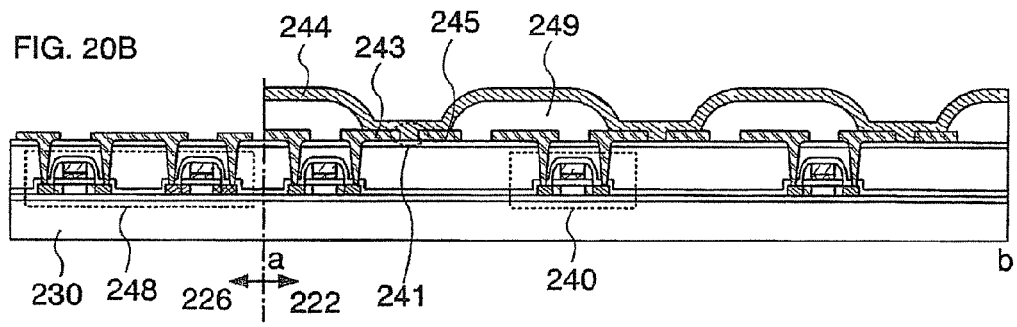

In FIGS. 5A to 5C or FIGS. 11A to 11C, memory element portions are formed with a stack in which an organic compound layer is sandwiched between a first conductive layer and a second conductive layer provided above and below the organic compound layer. Here, the first conductive layer 243 and the second conductive layer 245 are provided in the same layer to laterally sandwich the organic compound layer 244 thereby forming memory element portions (FIGS. 20A and 20B). In this case, the first conductive layer has a function of a source or drain electrode of each transistor 240 and the second conductive layer is also formed in the same layer as the source or drain electrode. If the first conductive layer 243 and the second conductive layer 245 can be formed using the same material, the first conductive layer 243 and the second conductive layer 245 can be formed concurrently; thus, the number of manufacturing steps can be reduced.

Figure 20C:
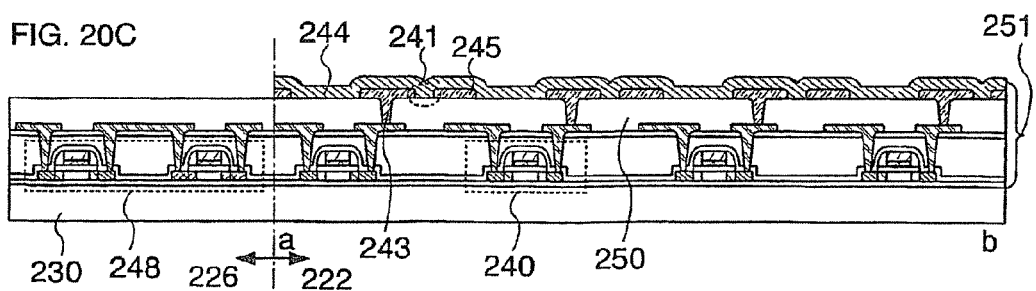

Alternatively, the insulating layers 250 can be provided as protective films so as to cover the source electrode and the drain electrode of each transistor 240, and first conductive layers 243 and second conductive layers 245 can be provided over the insulating layers 250 (FIG. 20C). This structure is effective in the case of forming a source and drain electrodes and the first conductive layers 243 with different materials, for example, in the case of providing the first conductive layers 243 with a light-transmitting material such as ITO.

Further, since the first conductive layers and the second conductive layers can be provided freely by forming the memory element portion with the insulating layers 250 provided, more highly integrated memory element portion can be provided. Also in this case, if the first conductive layers 243 and the second conductive layers 245 are concurrently formed with the same material, the number of the manufacturing steps can be reduced.

Note that, in the structure of FIGS. 20A to 20C, the first conductive layers 243 and the second conductive layers 245 may not necessarily be provided in the same layer. For example, in the structure of FIG. 20C, the second conductive layer 245 may be formed above the organic compound layer 244, so that the first conductive layers 243 and the second conductive layers 245 are obliquely arranged with the organic compound layer 244 provided above the first conductive layers 243 and below the second conductive layers 245. With such a structure, even if a contaminant such as dust exists on the first electrode, the contaminant can be prevented from affecting the memory element portion.

Figure 21A:
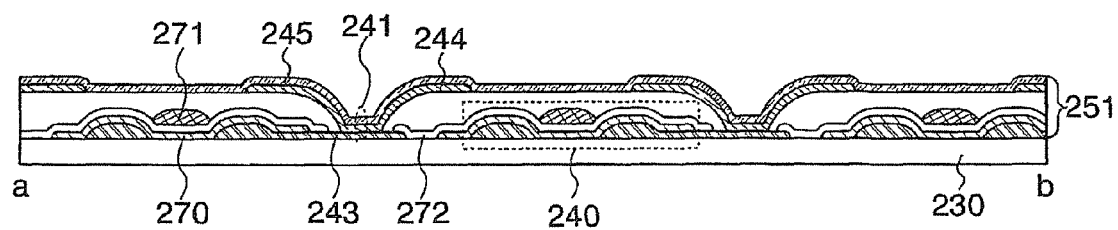
FIGS. 21A and 21B each show a structural example of a semiconductor device of the present invention.

In the above-described structure, the transistors may have any structure as long as they can function as switching elements. For example, transistors may be provided directly on a semiconductor substrate such as a Si substrate; thin film transistors may be formed over a glass substrate or a flexible substrate; or organic transistors in which a semiconductor layer is formed of an organic compound may be used. An example of the case of providing organic transistors as the transistors 240 will be shown in FIG. 21A. A layer 270 containing an organic material is formed so as to cover a conductive layer to be a source electrode or a drain electrode over a substrate, and a gate electrode 271 is formed above the layer 270 containing an organic material with a gate insulating film 272 interposed therebetween. The layer 270 containing an organic material serves as a channel region of each transistor 240 and one of the conductive layers, which is to be a source electrode or a drain electrode serves as a first conductive layer 243.

Figure 21B:
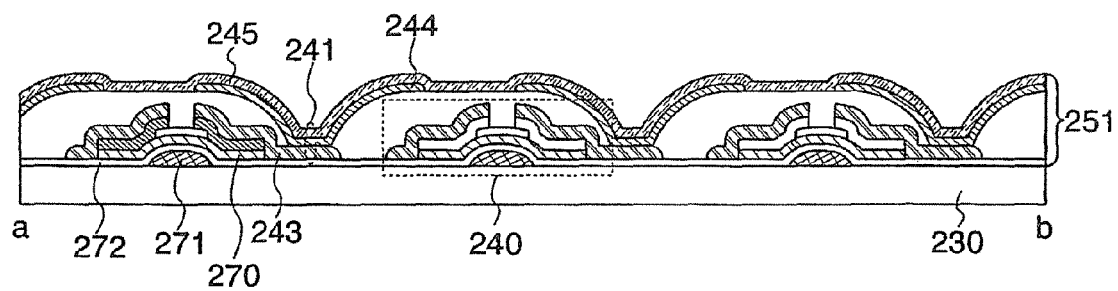

In this embodiment mode, an example of providing a planar thin film transistor over an insulative substrate; however, the transistor may be formed to have a staggered structure, an inverted staggered structure, or the like (FIG. 21B). In addition, the structure of thin film transistors is not limited to the structures described above, and a single gate structure in which one channel region is formed or a multi-gate structure such as a double gate structure in which two channel region are formed, or triple gate structure in which three channel region are formed can be used. Furthermore, a dual gate type in which two gate electrodes are arranged above and below a channel region with insulating layers therebetween.

Further, any structure may be used for a semiconductor layer included in the transistors. For example, an impurity region (including a source region, a drain region, and an LDD region) may be formed, and either a P-channel type or an N-channel type may be used. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

The first conductive layers 243 and the second conductive layers 245 can be similarly formed using materials and methods shown in Embodiment Mode 1.

In the case where data is written by optical action, either or both of the first conductive layer 243 and the second conductive layer 245 is formed with a light-transmitting conductive material shown in the above embodiment mode, or is formed thin enough to transmit light. In the case where data is written by electric action, there is no limitation on the materials for the first conductive layer 243 and the second conductive layer 245.

The organic compound layer 244 can be formed by a similar method using a similar material to the organic compound layer shown in Embodiment Mode 1.

Further, a rectifying element may be provided between the first conductive layer 243 and the organic compound layer 244 or between the second conductive layer 245 and the organic compound layer 244. The rectifying element typically refers to a Schottky diode, a diode having a PN junction, a diode having a PIN junction, or a transistor in which a gate electrode and a drain electrode are connected. Naturally, the rectifying element may be a diode having another structure. Thus, selectivity of a memory cell and margin of reading and writing can be improved by providing the rectifying element.

Figure 4B:
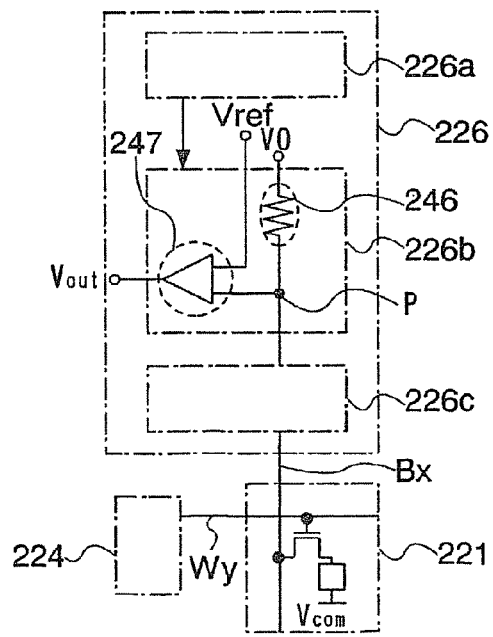
Figure 4C:
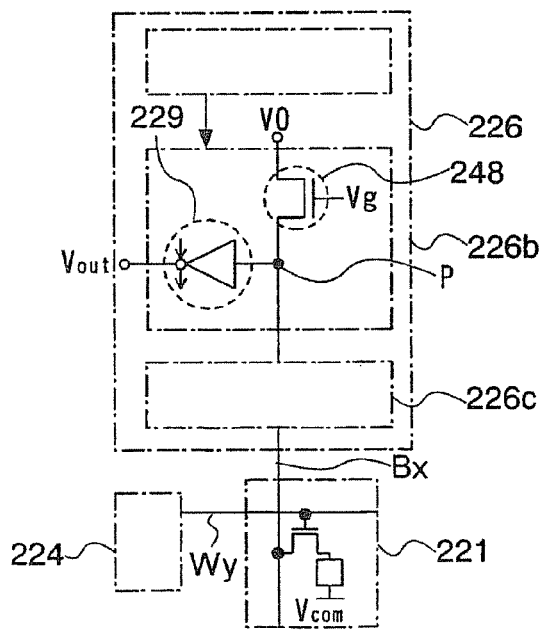

Next, operation of writing data into a memory circuit 216 will be explained (FIGS. 4A to 4C).

First, operation of writing data by electric action will be explained. Writing is conducted by changing electric characteristics of the memory cell, and an initial state (state without electric action) of the memory cell is data "0" and a state in which electric characteristics have been changed is data "1" in this embodiment mode.

Here, the case of writing data into the memory cell 221 in the n-th row and m-th column will be explained. In the case of writing data "1" into the memory cell 221, the memory cell 221 is selected first by the row decoder 224a, the column decoder 226a, and the selector 226c through an interface 223. Concretely, a predetermined voltage V22 is applied to a word line Wn connected to the memory cell 221 by the row decoder 224a. In addition, a bit line Bm connected to the memory cell 221 is connected to a read circuit 226b by the column decoder 226a and the selector 226c. Then, a write voltage V21 is outputted from the read circuit 226b into a bit line B3.

In this manner, a transistor 240 included in the memory cell is turned on, and an organic memory element 241 is electrically connected to a common electrode and a bit line to apply electric potential of approximately Vw=Vcom−V21. An organic compound layer 29 provided between the conductive layers is changed physically or electrically by appropriately selecting electric potential Vw so that data "1" is written. Concretely, in a reading operation voltage, electric resistance between the first conductive layer and second conductive layer in the state of data "1" may be changed so as to be drastically lowered compared with the electric resistance in the state of data "0", or simply, short circuit may be established. The voltage may be appropriately selected from the range of (V21, V22, Vcom)=(5 V to 15 V, 5 V to 15 V, 0 V) or (−12 V to 0 V, −12 V to 0 V, 3 V to 5 V). The electric potential Vw may be 5 V to 15 V or −5 V to −15 V. In this case, the distance between the pair of conductive layers provided so as to interpose the organic compound layer changes in some cases.

A non-selected word line and a non-selected bit line are controlled so that data "1" is not written into a memory cell which is to be connected to each of the non-selected word line and the non-selected bit line. Concretely, an electric potential (for example, 0 V) for turning off the transistor in the memory cell which is to be connected may be applied to the non-selected word line, and the non-selected bit line may be in a floating state or an electric potential equivalent to Vcom may be applied to the non-selected bit line.

On the other hand, in the case of writing data "0" into the memory cell 221, all that is required is that electric action is not applied to the memory cell 221. In circuit operation, for example, although the memory cell 221 is selected by the row decoder 224a, the column decoder 226a, and the selector 226c through an interface 223 in the same way as the case of writing data "1", an output electric potential from the read circuit 226b to the bit line B3 is set to be equivalent to Vcom or the bit line B3 is set to be in a floating state. As a result, a low electric potential (for example, −5 V to 5 V) or no electric potential is applied to the organic memory element 241; therefore, electric characteristics do not change and writing of data "0" is realized.

Subsequently, operation of writing data by optical action will be explained. In this case, an organic compound layer 244 included in the organic memory element 241 is irradiated with laser light from a conductive layer side, where the conductive layer has a light transmitting property (second conductive layer 245 here) using a laser irradiation apparatus.

The organic compound layer 244 is selectively irradiated with laser light; thus, the organic compound layer 244 is oxidized or carbonized to be insulated. Then, the value of resistance between the first conductive layer 243 and the second conductive layer 245 in the organic memory element 241 which is irradiated with laser light increases, whereas the resistance value of a organic memory element 241 which is not irradiated with laser light does not change.

Next, operation of reading data by electric action will be explained. Reading of data is carried out by using electronic characteristics of the organic memory element 241, which are different between a memory cell with data "0" and a memory cell with data "1". For example, a reading method by utilizing the difference in electric resistance will be explained, provided that electric resistance of the memory element included in the memory cell with data "0" is R0 at a reading voltage, and electric resistance of the memory element included in the memory cell with data "1" is R1 at a reading voltage (R1<<R0). As for a read circuit 226b, for example, a bit line driver circuit 226 using a resistor 246 and a differential amplifier 247 shown in FIG. 4B is conceivable as a structure of its reading portion. The resistor has a resistance value of Rr (R1<Rr<R0). A transistor 248 may be used instead of the resistor 246 and a clocked inverter 249 can be used instead of the differential amplifier (FIG. 4C). Naturally, a circuit configuration is not limited to FIGS. 4B and 4C.

In the case of reading data from the memory cell 221 in the n-th row and m-th column, the memory cell 221 is selected first by the row decoder 224a, the column decoder 226a, and the selector 226c through the interface 223. Concretely, a predetermined voltage V24 is applied to a word line Wn connected to the memory cell 221 by the row decoder 224a to turn on the transistor 240. In addition, a bit line Bm connected to the memory cell 221 is connected to a terminal P of the read circuit 226b by the column decoder 226a and the selector 226c. Accordingly, the electric potential Vp of the terminal P is a value determined by dividing Vcom and V0 by the resistor 246 (resistance value: Rr) and the organic memory element 241 (resistance value: R0 or R1). Therefore, the equation Vp0=Vcom+(V0−Vcom)*R0/(R0+Rr) holds in the case where the memory cell 221 has data "0". Alternatively, the equation Vp1=Vcom+(V0−Vcom)*R1/(R1+Rr) holds in the case where the memory cell 221 has data "1". As a result, by selecting Vref so as to be between Vp0 and Vp1 in FIG. 4B or by selecting the change point of the clocked inverter so as to be between Vp0 and Vp1 in FIG. 4C, Lo/Hi (or Hi/Lo) of output electric potential Vout is outputted in accordance with data "0"/"1" so that reading can be conducted.

For example, the differential amplifier is operated at Vdd=3 V, and Vcom, V0, and Vref are 0 V, 3 V, and 1.5 V, respectively. On the condition that the equation R0/Rr=Rr/R1=9 holds and on-resistance of the transistor 240 can be ignored, Hi is outputted as Vout at Vp0=2.7 V when a memory cell has data "0", or Lo is outputted as Vout at Vp1=0.3 V when a memory cell has data "1". In this way, reading from a memory cell can be conducted.

In accordance with the above method, reading is conducted by a voltage value utilizing the difference in a resistance value of the organic memory element 241 and resistance division. Naturally, the reading method is not limited thereto. For example, reading may be conducted by utilizing the difference in current values other than the method utilizing the difference in electric resistances. In the case where electric characteristics of the memory cell have different diode characteristics in threshold voltages in the case of data "0" and data "1", reading may be carried out by using difference in the threshold voltages.

Next, an example of reading data in a memory element portion by electric action will be explained with reference to FIGS. 18A and 18B.

Figure 18A:
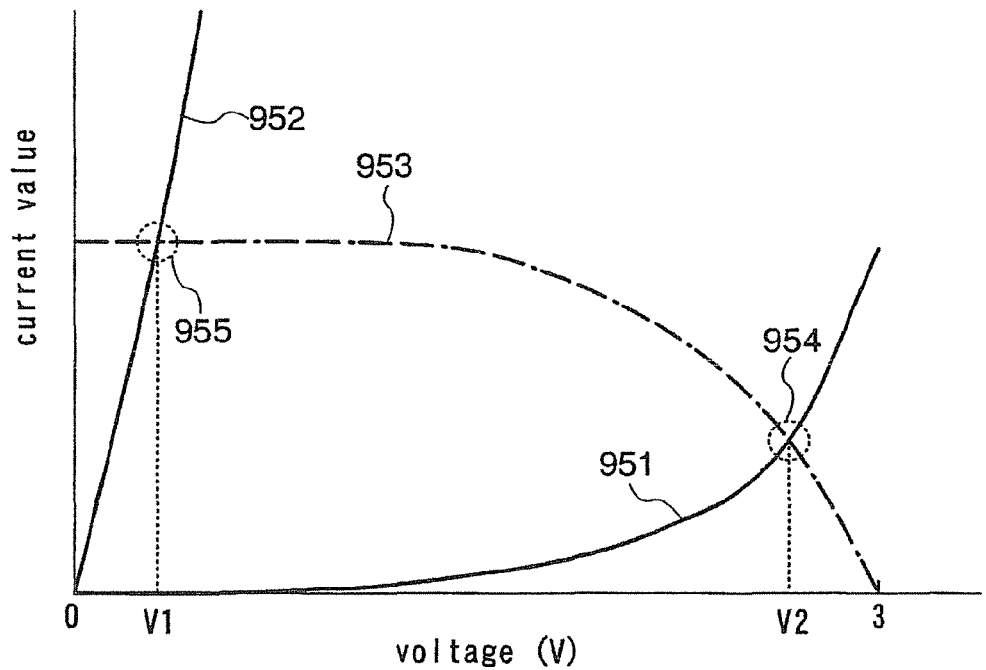
FIGS. 18A and 18B each explain reading of data stored in a semiconductor device of the present invention.

FIG. 18A shows the current-voltage characteristics 951 of a memory element when data [0] is written in the memory element, the current-voltage characteristics 952 of the memory element when data [1] is written in the memory element, and the current-voltage characteristics 953 of a resistor 246. Here, the case of using a transistor as a resistor 246 as shown in FIG. 18B will be described. In addition, the case of applying 3 V between a first conductive layer 243 and a second conductive layer 245 as operation voltage in reading data will be described.

Figure 18B:
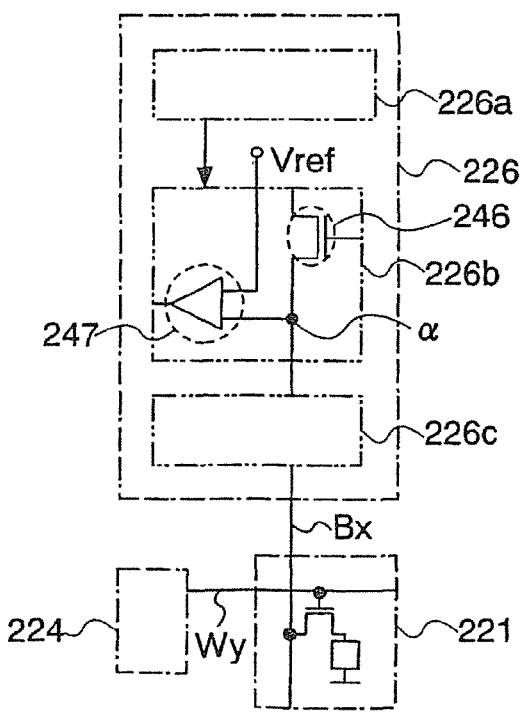

In FIGS. 18A and 18B, as for a memory cell having a memory element portion into which data [0] is written, an intersection point 954 of the current-voltage characteristics 951 of the memory element and the current-voltage characteristics 953 of the transistor is an operational point, and the potential of a node α at this time is V1 (V). The potential of the node α is supplied to a differential amplifier 247. The data stored in the memory cell is recognized as [0] in the differential amplifier 247.

Meanwhile, as for a memory cell having a memory element portion into which data [1] is written, an intersection point 955 of the current-voltage characteristics 952 of the memory element and the current-voltage characteristics 953 of the transistor is an operational point, and the potential of a node α at this time is V2 (V) (V1>V2). The potential of the node α is supplied to a differential amplifier 247. The data stored in the memory cell is recognized as [1] in the differential amplifier 247.

Thus, the data stored in the memory cell is distinguished by reading the potential divided by resistance in accordance with the resistance value of the memory element 241.

In this embodiment mode, crystallization of an organic compound layer can be suppressed by forming an organic compound layer using a layer in which an organic compound and organic compound are mixed; thus, a thick organic compound layer can be formed without increase in the resistance. Accordingly, even when irregularities due to dust or pollution are on a substrate, such a thicker organic compound layer is little affected by the irregularities. Therefore, defects such as a short circuit due to irregularities can be prevented. Further, even in the case where an organic memory is mounted over a flexible substrate, the organic memory can resist physical stress such as a bend by forming the layer of the memory element thickly.

Note that this embodiment mode can be freely combined with any of the above embodiment modes.

Embodiment Mode 3

In this embodiment mode, another example of a semiconductor device different from the above embodiment mode will be explained with reference to drawings.

A semiconductor device shown in this embodiment mode is capable of non-contact reading and writing of data. Data transmission method is broadly classified into three of an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide the antenna over a substrate provided with a plurality of elements, organic memory elements, and the like, and the other way is to provide a terminal portion on a substrate provided with a plurality of elements, organic memory elements, and the like and to connect an antenna provided over another substrate to the terminal portion.

First, an example of a structure of a semiconductor device in the case of providing an antenna over a substrate provided with a plurality of elements, organic memory elements, and the like will be explained with reference to FIGS. 6A and 6B.

Figure 6A:
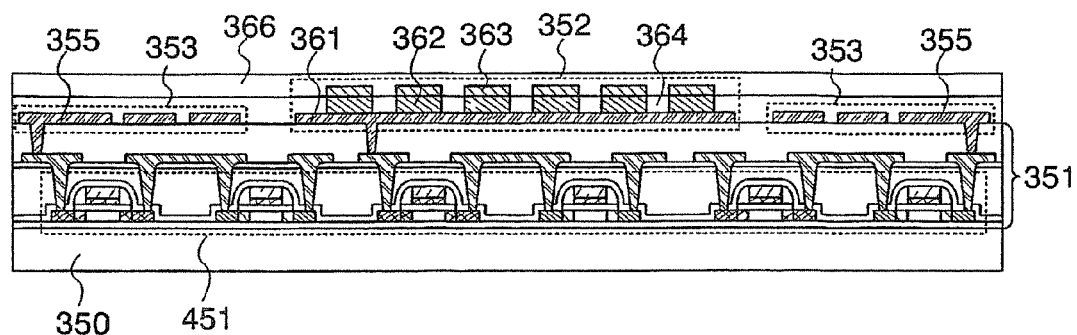
FIGS. 6A and 6B each show a structural example of a semiconductor device of the present invention.

FIG. 6A shows a semiconductor device including a passive matrix organic memory element. An element formation layer 351 including transistors 451 is provided over a substrate 350, and a memory element portion 352 and an antenna portion 353 are provided above the element formation layer 351. The case of providing the memory element portion 352 or the antenna portion 353 above the element formation layer 351 is shown here; however, the structure is not limited thereto. The memory element portion 352 or the antenna portion 353 can be provided below the element formation layer 351 or in the same layer.

A plurality of organic memory elements included in the memory element portion 352 are each provided with a stack of a first conductive layer 361, an organic compound layer 362, and a second conductive layer 363, and an insulating layer 366 which functions as a protective film is provided so as to cover the second conductive layer 363. The organic compound layer 362 may be formed over the entire surface so as to cover the first conductive layer 361; however, when influence of electric field in lateral directions between each adjacent memory cell is feared, an insulating layer 364 may be provided between each memory cell to isolate the organic compound layer. Note that the memory element portion 352 can be formed using materials and methods shown in the above embodiment modes.

In the memory element portion 352, a rectifying element may be provided between the first conductive layer 361 and the organic compound layer 362 or between the organic compound layer 362 and the second conductive layer 363 shown in the above embodiment modes. The rectifying element can be one of the above-described ones.

In an antenna portion 353, a conductive layer 355 which functions as an antenna is provided. Here, the conductive layer 355 is provided in the same layer as the first conductive layer 361, and the same material may be used to form the conductive layer 355 and the first conductive layer 361. The conductive layer 355 may be formed over the insulating layer 364 or the insulating layer 366. When the conductive layer 355 is provided over the insulating layer 364, it may can be formed using the same material as the second conductive layer 363.

As the material of the conductive layer 355, an element selected from gold (Au), platinum (Pt), nickel (Ni), tungsten (W), molybdenum (Mo), cobalt (Co), copper (Cu), aluminum (Al), manganese (Mn), or titanium (Ti) or an alloy containing a plurality of the elements can be used. Further, vapor deposition, sputtering, CVD, any printing method such as gravure printing or screen printing, or a droplet discharge method may be used to form the conductive layer 355.

The transistors 451 included in the element formation layer 351 each can be a p-channel TFT or an n-channel TFT, or a CMOS circuit combining a p-channel transistor and an n-channel transistor. Further, any structure may be used for a semiconductor layer included in the transistors 451. For example, an impurity region (including a source region, a drain region, and an LDD region) may be formed, and either a P-channel type or an N-channel type may be used. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

The transistors 451 included in the element formation layer 351 each may be an organic transistor in which a semiconductor layer is formed of an organic compound. In this case, the element formation layer 351 including the organic transistors can be formed by printing or a droplet discharge method directly over the substrate 350 that is a flexible substrate such as a plastic substrate. Further, in that case, a semiconductor device can be manufactured at low cost by also forming the memory element portion 352 by printing, a droplet discharge method, or the like as described above.

Figure 6B:
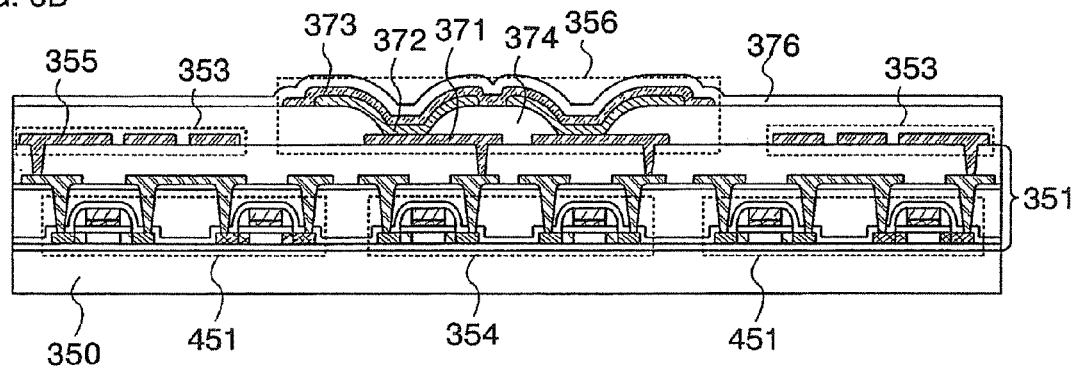

FIG. 6B shows an example of a semiconductor device having an active matrix organic memory. Note that part different from FIG. 6A will be explained about FIG. 6B.

As for a semiconductor device shown in FIG. 6B, an element formation layer 351 including transistors 451 and 354 is provided over a substrate 350, a memory element portion 356 and an antenna portion 353 are provided above the element formation layer 351. Here, the transistor 354 which functions as a switching element of the memory element portion 356 is provided in the same layer as the transistor 451, and the memory element portion and the antenna portion 353 are formed above the element formation layer 351. However, the structure is not limited thereto, and the transistor 453 may be provided above or below the element formation layer 351, or the memory element portion 356 and the antenna portion 353 can be provided below or in the same layer as the element formation layer 351.

The memory element portion 356 has a stack of a first conductive layer 371, an organic compound layer 372, and a second conductive layer 373, and an insulating layer 376 is provided as a protective film so as to cover the second conductive layer 373. Here, the insulating layer 374 is formed to cover an end of the first conductive layer 371, and the organic compound layer 372 is selectively formed in each memory cell; however, the organic compound layer 372 may be formed over the entire surface so as to cover the first conductive layer 371 and the insulating layer 374. The memory element portion 356 can be formed using materials and methods shown in the above embodiment modes. Further, in the memory element portion 356, a rectifying element may also be provided between the first conductive layer 371 and the organic compound layer 372 or between the second conductive layer 373 and the organic compound layer 372, as described above.

The conductive layer 355 provided in the antenna portion 353 may be formed in the same layer as the first conductive layer 371 or over the insulating layer 374 or the insulating layer 376. In the case where the conductive layer 355 is provided in the same layer as the first conductive layer 371 or the second conductive layer 373, the conductive layer 355 can be formed from the same material as the first conductive layer 371 or the second conductive layer 373 accordingly at the same process step.

The transistors 354 provided in the element formation layer 351 each function as a switching element in writing or reading data into the memory element portion 356. Therefore, the transistors 354 preferably have a structure of a P-channel type or an N-channel type. Further, a semiconductor layer included in the transistors 354 may have any structure. For example, an impurity region (including a source region, a drain region, and an LDD region) may be formed, and either a P-channel type or an N-channel type may be used. An insulating layer (sidewall) may be provided to be in contact with a side face of the gate electrode, or a silicide layer may be formed for a source region, a drain region, and the gate electrode. As a material for the silicide layer, nickel, tungsten, molybdenum, cobalt, platinum, or the like can be used.

Further, the element formation layer 351, the memory element portion 356, and the antenna portion 353 can be formed by vapor deposition, sputtering, CVD, a printing method, a droplet discharge method, or the like. In addition, different methods may be used to form different parts. For example, the transistors 451 which require high-speed operation are provided by crystallizing a semiconductor layer such as Si formed over a substrate, and then the transistors 354, each of which function as a switching element are provided as organic transistors above the element formation layer 351 with the use of printing or a droplet discharge method.

The memory element 356 shown in FIG. 6B has a structure in which the first conductive layer 371 is connected to a source or a drain electrode of a transistor of the element formation layer 351 with an insulating layer provided therebetween as shown in FIGS. 11B and 11C. However, the first conductive layer 371 may be provided in the same layer as the source or drain electrode of a transistor as shown in FIGS. 5B and 5C.

Figure 7A:
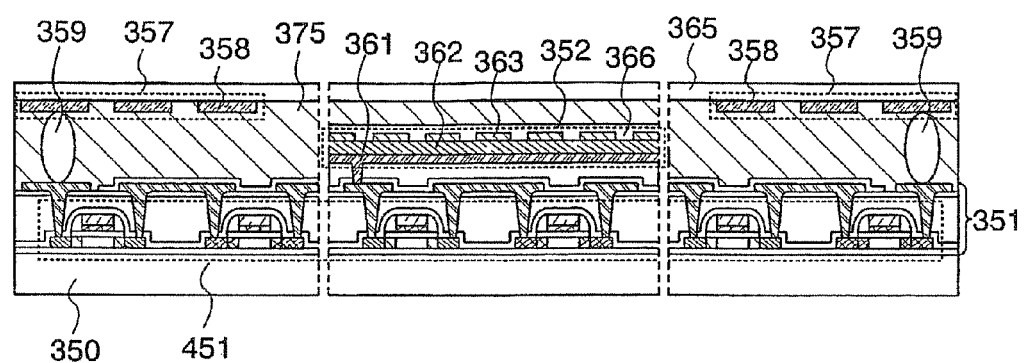
FIGS. 7A and 7B each show a structural example of a semiconductor device of the present invention.
Figure 7B:
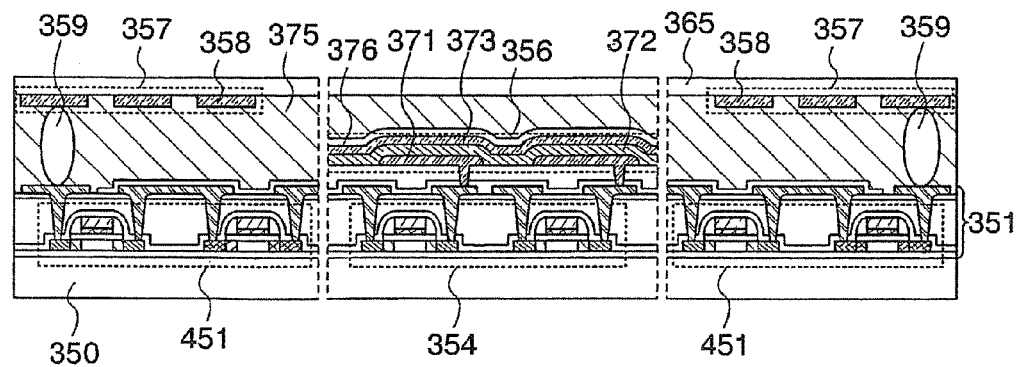

Next, an example of a structure of a semiconductor device in which a terminal portion is provided on a substrate provided with a plurality of elements and memory elements, and an antenna provided on another substrate is connected to the terminal portion will be descried with reference to FIGS. 7A and 7B. Note that part different from FIGS. 6A and 6B will be described about FIGS. 7A and 7B.

FIG. 7A shows a semiconductor device including a passive matrix organic memory. The element formation layer 351 is provided over a substrate 350, a memory element portion 352 is provided above the element formation layer 351, and an antenna portion 357 provided over a substrate 365 is provided so as to connect to the element formation layer. Here, the memory element portion 352 or the antenna portion 353 is provided above the element formation layer 351; however, the structure is not limited thereto. The memory element portion 352 may be provided below or in the same layer as the element formation layer 351, or the antenna portion 353 may be provided below the element formation layer 351.

The memory element portion 352 has a stack of a first conductive layer 361, an organic compound layer 362, and a second conductive layer 363. When disconnection in the organic compound layer 362 or influence of electric field in lateral directions between each adjacent memory cell is feared, an insulating layer may be provided between each memory cell to isolate the organic compound layer as shown in FIG. 6A. Note that the memory element portion 352 can be formed using materials and methods shown in the above embodiment modes.

The substrate including the element formation layer 351 and the memory element portion 352 is attached to the substrate 365 provided with the antenna portion 357 with an adhesive resin 375. The element formation layer 351 and a conductive layer 358 are electrically connected via conductive fine particles 359 contained in the resin 375. Alternatively, the substrate including the element formation layer 351 and the memory element portion 352 may be attached to the substrate 365 provided with the antenna portion 357 with a conductive adhesive such as silver paste, copper paste, or carbon paste, or by solder bonding.

FIG. 7B shows a semiconductor device provided with an organic memory shown in Embodiment Mode 2. The element formation layer 351 including transistors 451 and 354 is provided over a substrate 350, a memory element portion 352 is provided above the element formation layer 351, and an antenna portion 357 provided over a substrate 365 is provided so as to connect to the element formation layer. Here, the transistor 354 is provided in the same layer as the transistor 451 in the element formation layer 351, and the antenna portion 353 is provided above the element formation layer 351; however, the structure is not limited thereto. The memory element portion 352 may be provided below or in the same layer as the element formation layer 351, or the antenna portion 353 may be provided below the element formation layer 351.

The memory element portion 356 has a stack of a first conductive layer 371, an organic compound layer 372, and a second conductive layer 373. When influence of electric field in lateral directions between each adjacent memory cell is feared, an insulating layer may be provided between each memory cell to isolate the organic compound layer as shown in FIG. 6B. Note that the memory element portion 356 can be formed using materials and methods shown in the above embodiment modes.

Further, also in FIG. 7B, the substrate including the element formation layer 351 and the memory element portion 356 is attached to the substrate provided with the antenna portion 357 with a resin 375 containing conductive fine particles 359.

Thus, a semiconductor device provided with an organic memory and an antenna can be formed. Further, in this embodiment mode, an element formation layer may be provided by forming a thin film transistor over the substrate 350. Alternatively, a semiconductor substrate such as an Si substrate is used for the substrate 350 and an element formation layer may be provided by forming a filed effect transistor (FET) over the substrate. Furthermore, an SOI substrate may be used for the substrate 350 and an element formation layer may be provided thereover. In this case, the SOI substrate may be formed by attaching wafers or by using a method called SIMOX by which an insulating layer is formed inside a substrate by implanting oxygen ions into a Si substrate.

In the semiconductor device including an organic memory shown in this embodiment mode, the memory element portion of the organic memory is formed with a mixed layer in which an organic compound and an inorganic compound are mixed, so that the layer can be formed thickly without increase in resistance. Therefore, the semiconductor device can resist physical force such as a bend even when the semiconductor device is provided over a flexible substrate. Further, even when irregularities due to dust or pollution are on a substrate, such a thicker organic compound layer is little affected by the irregularities. Therefore, defects such as a short circuit in a memory cell due to irregularities can be prevented.

This embodiment mode can be freely combined with any of the above embodiment modes.

Embodiment Mode 4

In this embodiment mode, a semiconductor device including a thin film transistor, a memory element, and an antenna according to the invention will be described with reference to the drawings.

Figure 12A:
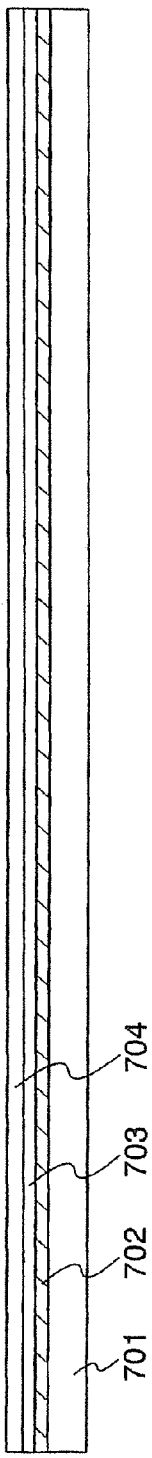
FIGS. 12A to 12C show manufacturing steps of a semiconductor device of the present invention.

First, a release layer 702 is formed over a surface of a substrate 701 (FIG. 12A). The substrate 701 may be a glass substrate, a quartz substrate, a substrate in which an insulating layer is formed over a surface of a metal substrate, or a stainless-steel substrate, or a plastic substrate which can resist the treatment temperature of the manufacturing process. In the case of such a substrate, the area and the shape thereof are not particularly restricted; therefore, by using a rectangular substrate with at least one meter length on a side, the productivity can be drastically improved, for example. This merit is greatly advantageous as compared to the case of using a circular silicon substrate. In addition, the release layer 702 is formed over an entire surface of the substrate 701 in the process; however, the release layer 702 may be selectively provided as necessary by selective etching by photolithography after the release layer is formed over the entire surface of the substrate 701. It is to be noted that the release layer 702 is formed so as to contact the substrate 701; however, an insulating layer may be formed as a base film to contact the substrate 701 as necessary and the release layer 702 may be formed to contact the insulating layer.

The release layer 702 is formed in a single layer or a layered structure with a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), an alloy material or a compound material containing the above described element as its main component by using a known means (sputtering, plasma CVD, or the like). The structure of the layer containing silicon may have any crystal structure of amorphous, microcrystal, or polycrystalline structure.

In the case where the release layer 702 has a single layer structure, a tungsten layer, a molybdenum layer, or a layer containing a mixture of tungsten and molybdenum is formed for example. Alternatively, a layer containing oxide or oxynitride of tungsten, a layer containing oxide or oxynitride of molybdenum, or a layer containing oxide or oxynitride of a mixture of tungsten and molybdenum is formed. It is to be noted that a mixture of tungsten and molybdenum corresponds to an alloy of tungsten and molybdenum. Further, oxide of tungsten can be referred to as tungsten oxide.

In the case where the release layer 702 has a layered structure, a tungsten layer, a molybdenum layer, or a layer containing a mixture of tungsten and molybdenum is formed as a first layer. A layer containing oxide, nitride, oxynitride, or nitride oxide of tungsten, a layer containing oxide, nitride, oxynitride, or nitride oxide of molybdenum, or a layer containing oxide, nitride, oxynitride, or nitride oxide of a mixture of tungsten and molybdenum is formed as a second layer.

When a stack of a layer containing tungsten and a layer containing oxide of tungsten is formed as the release layer 702, the layer containing tungsten is formed and a layer containing silicon oxide may be formed so that oxide of tungsten is formed at the interface between the tungsten layer and the silicon oxide layer. This also applies to the case where a layer containing nitride, oxynitride, and nitride oxide of tungsten. In this case, after a layer containing tungsten is formed, a silicon nitride layer, a silicon oxynitride layer, a silicon nitride oxide layer may be formed thereover. The tungsten oxide is denoted by WOx and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. In forming an oxide of tungsten, the above value of X is not limited in particular, and which oxide to form can be determined based on an etching rate or the like. The layer containing tungsten oxide (WOx, 0<X<3) which is formed by sputtering in an oxygen atmosphere is preferable to obtain the most preferable etching rate. Therefore, in order to reduce time of manufacture, the release layer may preferably be formed with a layer containing tungsten oxide which is formed by sputtering in an oxygen atmosphere.

Next, an insulating layer 703 to be a base is formed to cover the release layer 702. The insulating layer 703 to be a base is formed by a layer containing oxide of silicon or nitride of silicon in a single layer or a layered structure with a layer containing oxide of silicon or nitride of silicon by a known means (sputtering, plasma CVD, or the like). Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. In the case where the insulating layer to be a base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first-layer insulating layer, a second-layer insulating layer, and a third-layer insulating layer respectively. Alternatively, a silicon oxynitride layer, a silicon nitride oxide layer, and a silicon oxynitride layer may be formed as a first-layer insulating layer, a second-layer insulating layer, and a third-layer insulating layer respectively. The insulating layer to be a base functions as a blocking film for preventing impurities entering from the substrate 701.

Figure 12B:
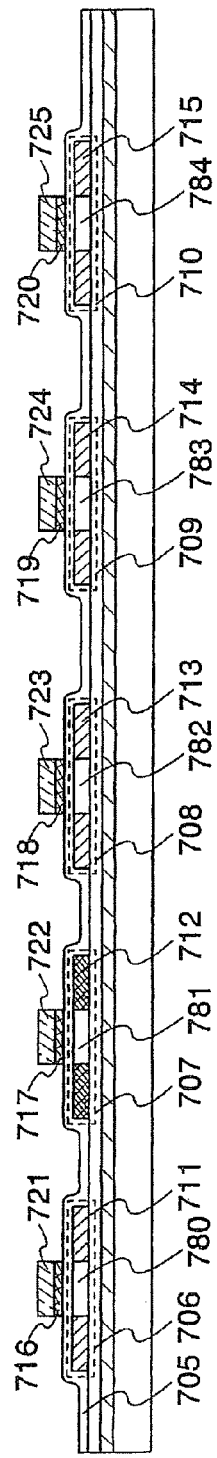

Subsequently, an amorphous semiconductor layer 704 (for example, a layer containing amorphous silicon) is formed over the insulating layer 703. The amorphous semiconductor layer 704 is formed to a thickness of 25 nm to 200 nm (preferably 30 nm to 150 nm) by a known means (sputtering, LPCVD, plasma CVD, or the like). The amorphous semiconductor layer 704 is crystallized by a known crystallization method (laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor layer. The obtained crystalline semiconductor layer is then etched into a desired shape, thereby crystalline semiconductor layers 706 to 710 are formed (FIG. 12B).

An example of formation steps of the crystalline semiconductor layers 706 to 710 will be described briefly as follows. First, an amorphous semiconductor layer is formed to a thickness of 66 nm by plasma CVD. Next, a solution containing nickel that is a metal element for promoting crystallization is applied onto the amorphous semiconductor layer, and dehydrogenation treatment (at 500° C., for 1 hour) and thermal crystallization treatment (at 550° C., for 4 hours) are performed on the amorphous semiconductor layer, thereby a crystalline semiconductor layer is formed. After that, the crystalline semiconductor layer is irradiated with laser light as needed, and photolithography is performed to form the crystalline semiconductor layers 706 to 710. In the case where the laser crystallization method is employed for forming the crystalline semiconductor layer, a continuous wave or pulsed gas laser or solid-state laser is used. As the gas laser, an excimer laser, a YAG laser, a YVO4 laser, a YLF laser, a YAlO$_3$ laser, a glass laser, a ruby laser, a Ti: sapphire laser, or the like is used. As the solid-state laser, a laser using a crystal such as YAG, YVO4, YLF, and YAlO$_3$ doped with Cr, Nd, Er, Ho, Ce, Co, Ti, or Tin is used.

In addition, the crystallization of the amorphous semiconductor layer by using the metal element for promoting crystallization is advantageous because the crystallization can be performed at low temperature in short time and the direction of crystals becomes uniform. Meanwhile, there is also a problem that the characteristics are not stable because the off-state current is increased due to a residue of the metal element in the crystalline semiconductor layer. Therefore, it is preferable to form an amorphous semiconductor layer as a gettering site over the crystalline semiconductor layer. The amorphous semiconductor layer to be a gettering site is required to contain an impurity element such as phosphorous or argon; accordingly, it is preferably formed by sputtering by which argon can be contained at high concentration. Subsequently, heat treatment (RTA, thermal annealing using an annealing furnace, or the like) is performed to diffuse the metal element into the amorphous semiconductor layer, and the amorphous semiconductor layer containing the metal element is removed therefrom. In this manner, the content of the metal element in the crystalline semiconductor layer can be reduced or eliminated.

Then, a gate insulating film 705 is formed to cover the crystalline semiconductor layers 706 to 710. The gate insulating film 705 is formed with a single layer or a stack of a layer containing oxide of silicon or nitride of silicon by a known means (plasma CVD or sputtering). Specifically, a layer containing silicon oxide, a layer containing silicon oxynitride, or a layer containing silicon nitride oxide is formed in a single layer or layered structure.

Subsequently, a first conductive layer and a second conductive layer are stacked on the gate insulating film 705. The first conductive layer is formed to a thickness of 20 to 100 nm by a known means (plasma CVD or sputtering). The second conductive layer is formed to a thickness of 100 to 400 nm by a known means. The first conductive layer and the second conductive layer are formed by using an element selected from tantalum (Ta), tungsten (W), titanium (Ti), molybdenum (Mo), aluminum (Al), copper (Cu), chromium (Cr), niobium (Nb), or the like, an alloy material or a compound material containing the above-described element as its main component. Alternatively, a semiconductor material, typically poly-crystalline silicon doped with an impurity element such as phosphorus, may be used. As a combination of the first conductive layer and the second conductive layer, a tantalum nitride (TaN) layer and a tungsten (W) layer, a tungsten nitride (WN) layer and a tungsten layer, a molybdenum nitride (MoN) layer and a molybdenum (Mo) layer, or the like can be used for example. Since tungsten, tantalum nitride, or the like has high heat resistance, heat treatment for thermal activation can be performed after the first conductive layer and the second conductive layer are formed. Alternatively, in the case of employing a three-layer structure instead of a two-layer structure, a layered structure of a molybdenum layer, an aluminum layer, and a molybdenum layer may be employed.

Then, a resist mask is formed by photolithography and etching treatment for forming a gate electrode and a gate line is performed, thereby conductive layers (also referred to as gate electrodes) 716 to 725 each functioning as a gate electrode are formed.

Next, another resist mask is formed by photolithography. Then, an impurity element imparting N-type conductivity is added into the crystalline semiconductor layers 706, and 708 to 710 at low concentration by ion doping or ion implantation to form N-type impurity regions 711, and 713 to 715 and channel regions 780, and 782 to 784. An element belonging to group 15 of Periodic Table may be used for the impurity element imparting N-type conductivity. For example, phosphorus (P) or arsenic (As) is used.

Next, another resist mask is formed by photolithography. Then, an impurity element imparting p-type conductivity is added into the crystalline semiconductor layer 707 to form a p-type impurity region 712 and a channel region 781. For example, boron (B) is used for the impurity element imparting p-type conductivity.

Figure 12C:
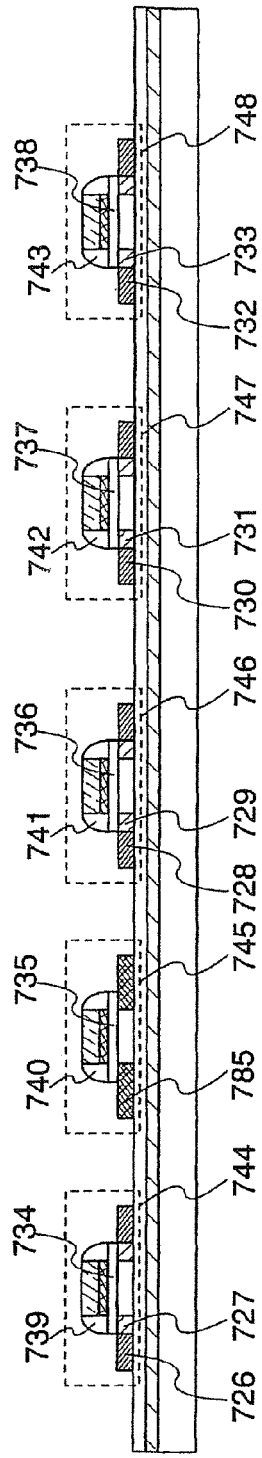

Next, an insulating layer is formed so as to cover the gate insulating film 705 and the conductive layers 716 to 725. The insulating layer is formed with a single layer or a stack of a layer containing an inorganic material such as silicon, oxide of silicon, or nitride of silicon, or a layer containing an organic material such as an organic resin by a known means (plasma CVD or sputtering). Then, the insulating layer is selectively etched by anisotropic etching mainly in the vertical direction, thereby insulating layers (also referred to as sidewalls) 739 to 743 in contact with the side faces of the conductive layers 716 to 725 are formed (see FIG. 12C). Concurrently with the formation of the insulating layers 739 to 743, insulating layers 734 to 738 are formed by etching the insulating layer 705. The insulating layers 739 to 743 are used as masks for doping in the formation of an LDD (Lightly Doped Drain) region subsequently.

Then, using the mask formed of a resist by photolithography and the insulating layers 739 to 743 as masks, an impurity element imparting N-type conductivity is added into the crystalline semiconductor layers 706, and 708 to 710 so that first N-type impurity regions (also referred to as LDD regions) 727, 729, 731, and 733 and second N-type impurity regions 726, 728, 730, and 732 are formed. The concentration of the impurity element in the first N-type impurity regions 727, 729, 731, and 733 is lower than the concentration of the impurity element in the second N-type impurity regions 726, 728, 730, and 732. Through the above-described steps, N-type thin film transistors 744, and 746 to 748 and a p-type thin film transistor 745 are completed.

It is to be noted that for forming the LDD region, it is preferable that a sidewall insulating layer is used as a mask. The method which uses a sidewall insulating layer as a mask is easy to control the width of the LDD region, and the LDD region can be formed certainly.

Figure 13A:
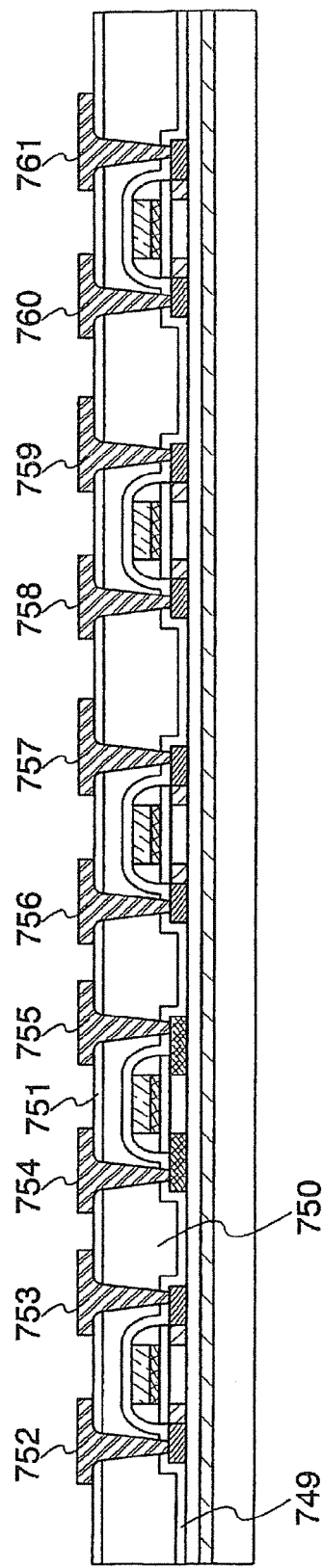
FIGS. 13A and 13B show manufacturing steps of a semiconductor device of the present invention.

Then, an insulating layer is formed in a single layer or layered structure so as to cover the thin film transistors 744 to 748 (FIG. 13A). The insulating layer covering the thin film transistors 744 to 748 is formed with a single layer or a stack using an inorganic material such as oxide of silicon or nitride of silicon, an organic material such as polyimide, polyamide, benzocyclobutene, acrylic, epoxy resin, and siloxane, or the like by a known means (an SOG method, a droplet discharge method, or the like). A siloxane material contains an Si—O—Si bond. Siloxane includes a skeleton formed by a bond of silicon (Si) and oxygen (O), in which an organic group containing at least hydrogen (such as an alkyl group or aromatic hydrocarbon) is contained as a substituent. Alternatively, a fluoro group may be used as the substituent. Further alternatively, a fluoro group and an organic group containing at least hydrogen may be used as the substituent. For example, in the case where the insulating layer covering the thin film transistors 744 to 748 have a three-layer structure, a layer containing silicon oxide may be formed as a first-layer insulating layer 749, preferably, a layer containing a resin may be formed as a second-layer insulating layer 750, and a layer containing silicon nitride may be formed as a third-layer insulating layer 751.

It is to be noted that before the insulating layers 749 to 751 are formed or after one or more of thin layers of the insulating layers 749 to 751 are formed, heat treatment for recovering the crystallinity of the semiconductor layer, for activating the impurity element which has been added into the semiconductor layer, or for hydrogenating the semiconductor layer is preferably performed. For the heat treatment, thermal annealing, laser annealing, RTA, or the like is preferably used.

Then, the insulating layers 749 to 751 are etched by photolithography to form contact holes so that the N-type impurity regions 726, and 728 to 732 and the p-type impurity region 785 are exposed. Subsequently, a conductive layer is formed so as to fill the contact holes and patterned to form conductive layers 752 to 761 each functioning as a source or drain wiring.

The conductive layers 752 to 761 are formed with a single layer or a stack using an element selected from titanium (Ti), aluminum (Al), or neodymium (Nd); an alloy material or a compound material containing the above-described element as its main component by a known means (plasma CVD or sputtering). An alloy material containing aluminum as its main component corresponds to an alloy material containing nickel whose main component is aluminum or an alloy material containing nickel and one or both of carbon and silicon whose main component is aluminum, for example. Each of the conductive layers 752 to 761 preferably uses, for example, a layered structure of a barrier layer, an aluminum-silicon (Al—Si) layer, and a barrier layer, or a layered structure of a barrier layer, an aluminum-silicon (Al—Si) layer, a titanium nitride (TiN) layer, and a barrier layer. It is to be noted that a barrier layer corresponds to a thin layer formed using titanium, nitride of titanium, molybdenum, or nitride of molybdenum. Aluminum and aluminum silicon which have low resistance and are inexpensive, so that they are suitable for forming the conductive layers 752 to 761. In addition, generation of a hillock of aluminum or aluminum silicon can be prevented when upper and lower barrier layers are provided. Further, when the barrier layer is formed by using titanium that is a highly-reducible element, even if a thin natural oxide layer is formed on the crystalline semiconductor layer, the natural oxide film is reduced so that preferable contact with the crystalline semiconductor layer can be obtained.

Figure 13B:
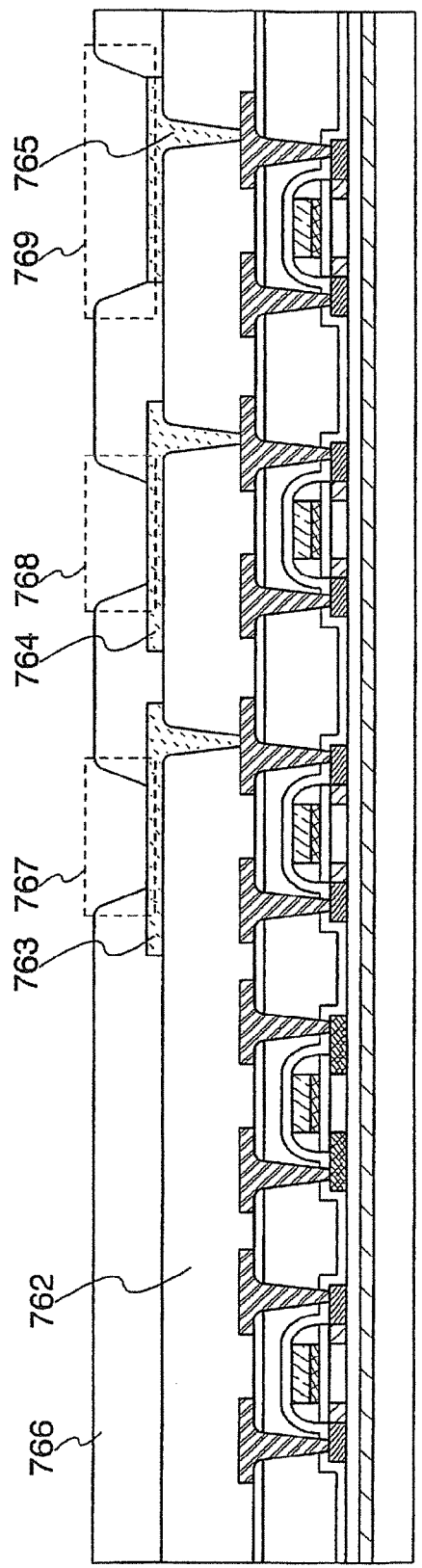

Next, an insulating layer 762 is formed so as to cover the conductive layers 752 to 761 (FIG. 13B). The insulating layer 762 is formed with a single layer or a stack using an inorganic material or an organic material by a known means (an SOG method, a droplet discharge method, or the like). The insulating layer 762 is preferably formed to a thickness of 0.75 µm to 3 µm.

Subsequently, the insulating layer 762 is etched by photolithography to form contact holes in which the conductive layers 757, 759, and 761 are exposed. Then, a conductive layer is formed so as to fill the contact holes. The conductive layer is formed by a known means (plasma CVD or sputtering) using a conductive material. The conductive layer is patterned to form conductive layers 763 to 765. It is to be noted that the conductive layers 763 to 765 correspond to one of a pair of conductive layers included in a memory element. Therefore, the conductive layers 763 to 765 are preferably formed with a single layer or a stack using titanium, an alloy material or a compound material containing titanium as its main component. Titanium which has low resistance, which enables size reduction of the memory element, thereby high integration can be realized. In addition, in the photolithography step for forming the conductive layers 763 to 765, it is preferable to perform wet etching in order to prevent damage to the thin film transistors 744 to 748 that are lower layers; hydrogen fluoride (HF) or mixed solution of ammonia and oxygenated water ($NH_3$ and $H_2O_2$) is preferably used as the etchant.

Then, an insulating layer 766 is formed so as to cover the conductive layers 763 to 765. The insulating layer 766 is formed with a single layer or a stack using an inorganic material or an organic material by a known means (an SOG method, a droplet discharge method, or the like). In addition, the insulating layer 762 is preferably formed to a thickness of 0.75 µm to 3 µm. The insulating layer 766 is then etched by photolithography to form contact holes 767 to 769 in which the conductive layers 763 to 765 are respectively exposed.

Figure 14A:
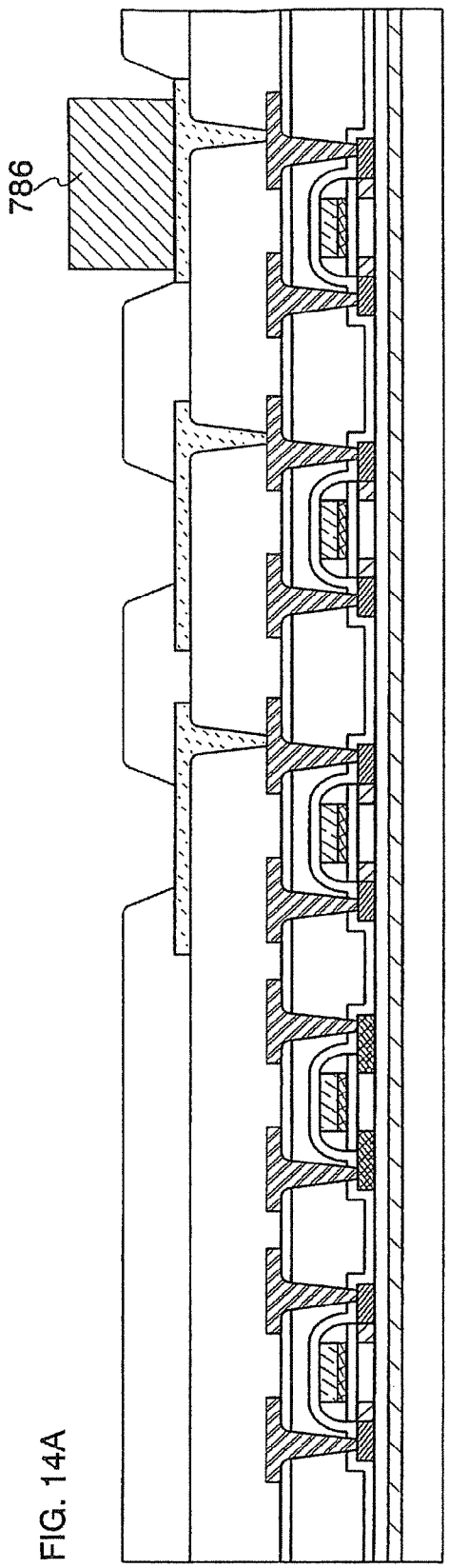
FIGS. 14A and 14B show manufacturing steps of a semiconductor device of the present invention.

Subsequently, a conductive layer 786 functioning as an antenna which is in contact with the conductive layer 765 is formed (FIG. 14A). The conductive layer 786 is formed by a known means (plasma CVD, sputtering, printing, or a droplet discharge method) using a conductive material. Preferably, the conductive layer 786 is formed with a single layer or a stack using an element selected from aluminum (Al), titanium (Ti), silver (Ag), or copper (Cu), an alloy material or a compound material containing the above-described element as its main component. Specifically, the conductive layer 786 is formed by screen printing using a paste containing silver and heat treatment thereafter at 50° C. to 350° C. Alternatively, an aluminum layer is formed by sputtering, and is patterned to form the conductive layer 786. The patterning of the aluminum layer is preferably performed by wet etching, and heat treatment at 200° C. to 300° C. is preferably conducted after the wet etching.

Figure 14B:
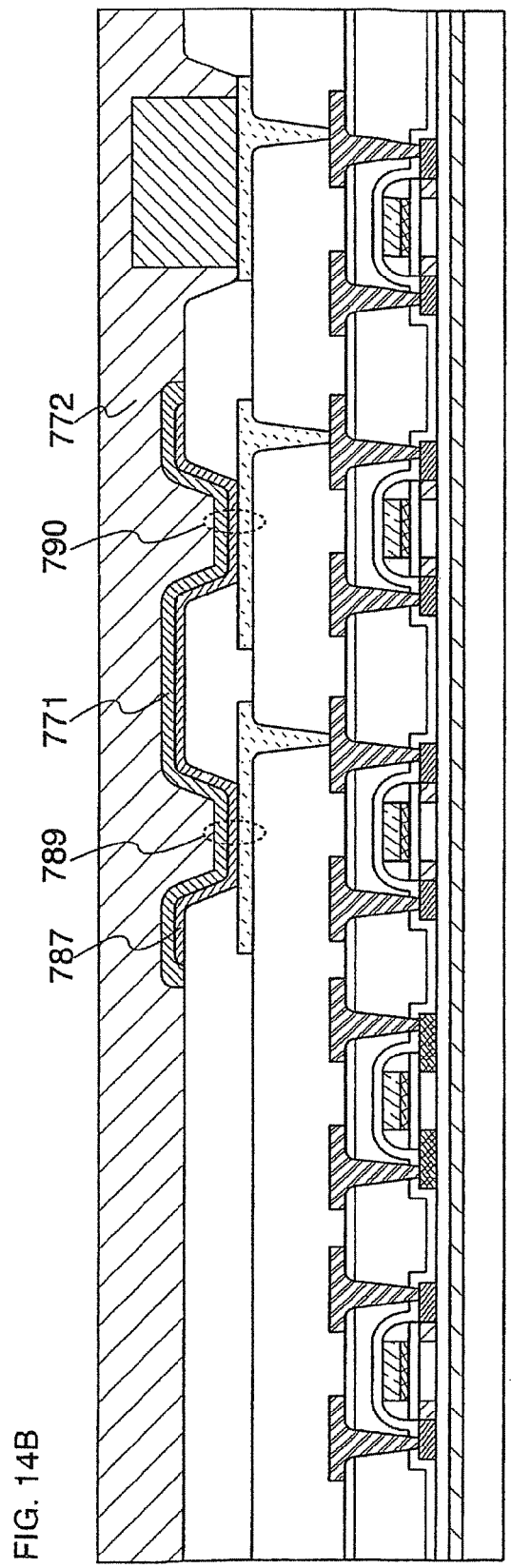

Next, an organic compound layer 787 is formed in contact with the conductive layers 763 and 764 (FIG. 14B). The organic compound layer 787 is formed by a known means (a droplet discharge method, vapor deposition, or the like). Subsequently, a conductive layer 771 is formed in contact with the organic compound layer 787. The conductive layer 771 is formed by a known means (sputtering or vapor deposition).

Through the above-described steps, a memory element portion 789 which includes the conductive layer 763, the organic compound layer 787, and the conductive layer 771, and a memory element portion 790 which includes the conductive layer 764, the organic compound layer 787, and the conductive layer 771 are completed.

It is to be noted that according to the manufacturing steps described above, the step for forming the organic compound layer 787 is carried out after the step for forming the conductive layer 786 functioning as an antenna because the heat resistance of the organic compound layer 787 is not high.

Subsequently, an insulating layer 772 functioning as a protective film is formed by a known means (an SOG method, a droplet discharge method, or the like) so as to cover the memory element portions 789 and 790 and the conductive layer 786 functioning as an antenna. The insulating layer 772 is formed with a layer containing carbon such as DLC (Diamond Like Carbon), a layer containing silicon nitride, a layer containing silicon nitride oxide, or an organic material, or preferably formed of an epoxy resin.

Figures 15A, 15B:
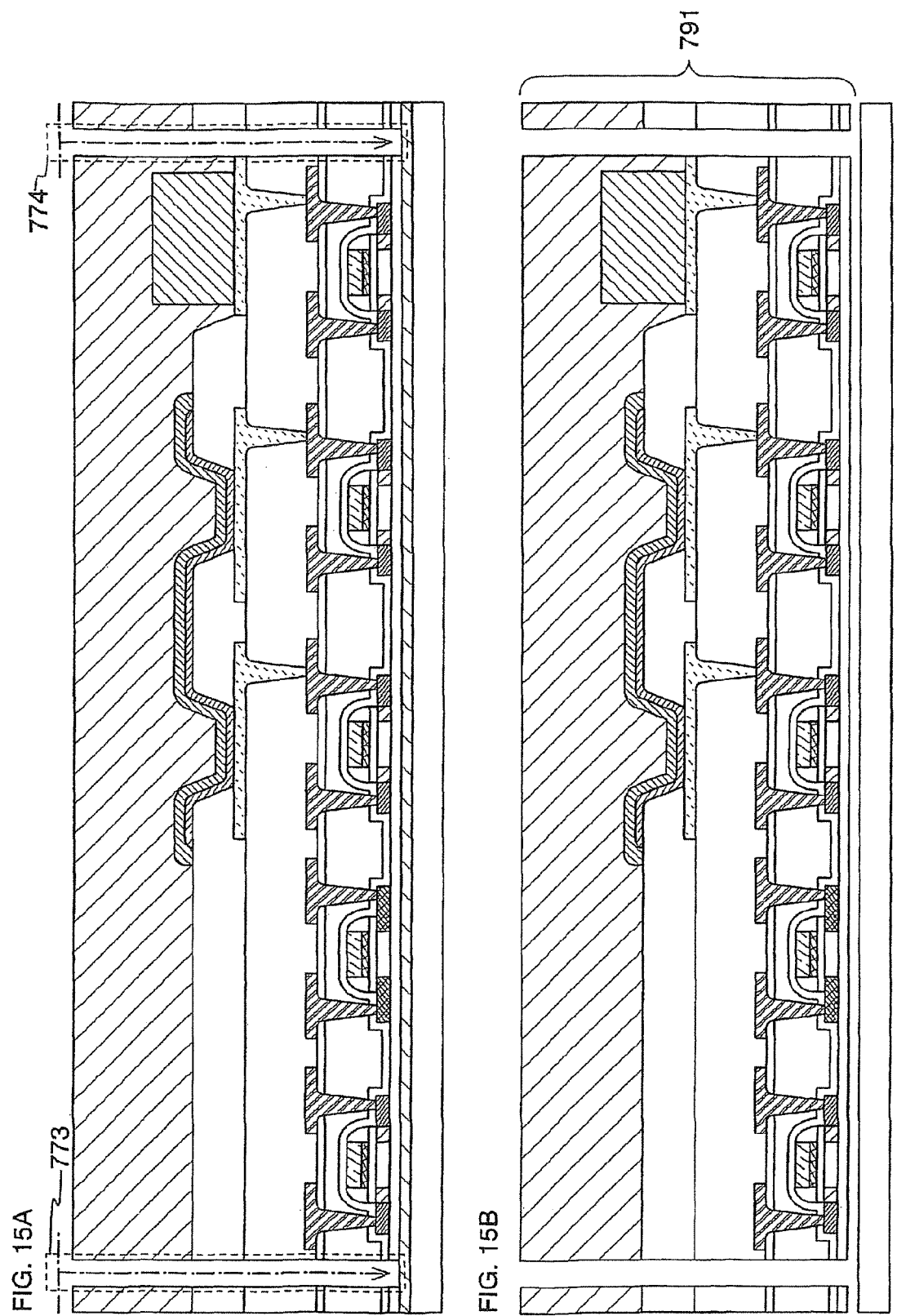
FIGS. 15A and 15B show manufacturing steps of a semiconductor device of the present invention.

The insulating layer is then etched by photolithography or laser light irradiation to form openings 773 and 774 so that the release layer 702 is exposed (FIG. 15A).

Subsequently, the release layer 702 is removed by injecting an etchant into the openings 773 and 774 (FIG. 15B). As the etchant, a gas or a liquid containing halogen fluoride or an interhalogen compound is used; for example, chlorine trifluoride ($ClF_3$) is used as a gas containing halogen fluoride. Accordingly, a thin film integrated circuit 791 is separated from the substrate 701. It is to be noted herein that the thin film integrated circuit 791 includes an element group including the thin film transistors 744 to 748 and the memory element portions 789 and 790, and the conductive layer 786 functioning as an antenna. The release layer 702 may be partially left without being removed entirely. By leaving a part of the release layer 702, time of manufacture can be shortened.

It is preferable to reuse the substrate 701 after the thin film integrated circuit 791 is separated, thereby reducing the cost. In addition, the insulating layer 772 is formed to prevent the thin film integrated circuit 791 from scattering after the release layer 702 is removed. The thin film integrated circuit 791 which is small, thin, and light easily scatters after the release layer 702 is removed since it is not attached firmly to the substrate 701. However, by forming the insulating layer 772 on the thin film integrated circuit 791, the thin film integrated circuit 791 is weighed and scattering from the substrate 701 can be prevented. In addition, by forming the insulating layer 772, the thin film integrated circuit 791 which is thin and light alone is not rolled after the substrate 701 is separated, and a measure of strength can be ensured.

Figure 16:
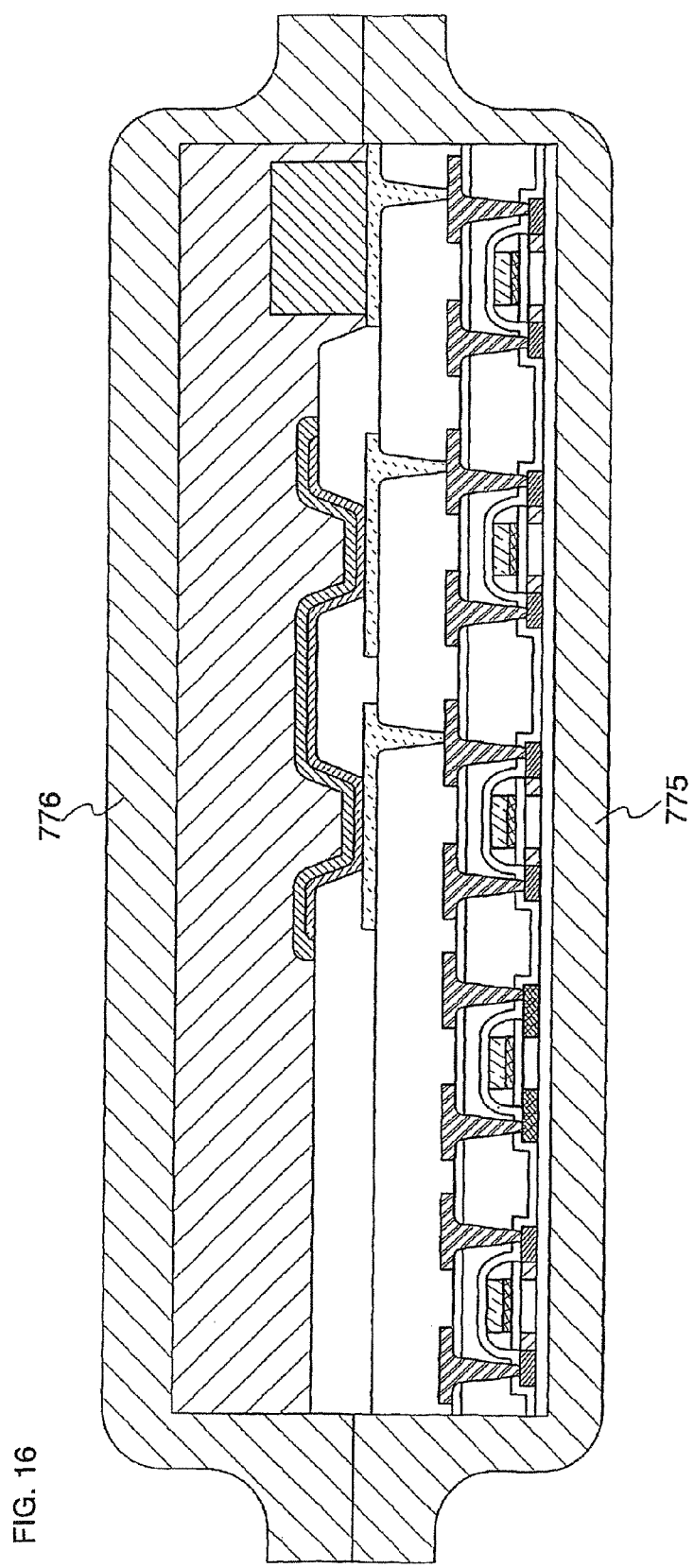
FIG. 16 shows a manufacturing step of a semiconductor device of the present invention.

Subsequently, one surface of the thin film integrated circuit 791 is attached to a first support 776, and the thin film integrated circuit 791 is completely peeled off the substrate 701 (FIG. 16). Then, a second support 775 is provided on the other surface of the thin film integrated circuit 791, and one or both of heat treatment and pressure treatment are performed to seal the thin film integrated circuit 791 with the first support 776 and the second support 775. Each of the first support 776 and the second support 775 is a film formed of polypropylene, polyester, vinyl, polyvinyl fluoride, polyvinyl chloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. The films are subjected to heat treatment and pressure treatment by thermocompression bonding. An adhesive layer which is provided on the outermost surface of the adhesive layer or a layer (not an adhesive layer) which is provided on the outermost layer thereof is melted by heart treatment, and then is pressured, so that the films are attached. An adhesive layer may be provided on a surface of the first support 776 or the second support 775, or it may not be provided. The adhesive layer is a layer containing an adhesive such as a heat curable resin, an ultraviolet-curable resin, an epoxy resin-based adhesive, or a resin additive.

Through the above steps a flexible semiconductor device can be manufactured.

This embodiment mode can be freely combined with any of the above embodiment modes.

Embodiment Mode 5

In this embodiment mode, the case of using a semiconductor device of the invention as a wireless chip capable of non-contact data communication will be described with reference to FIGS. 8A to 8C.

Figure 8A:
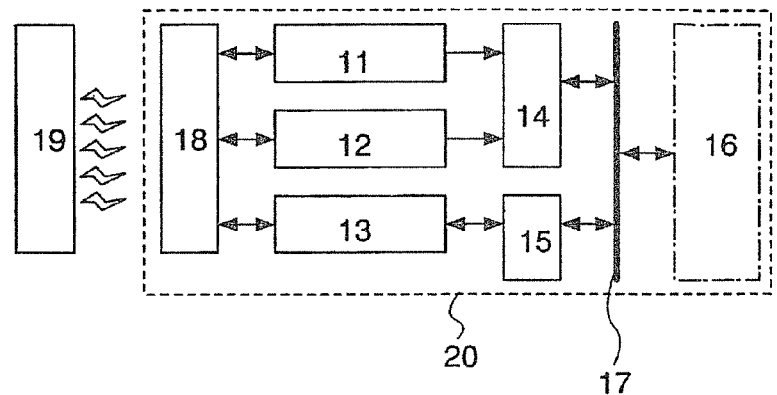
FIGS. 8A to 8C each show a use of a semiconductor device of the present invention.
Figure 8B:
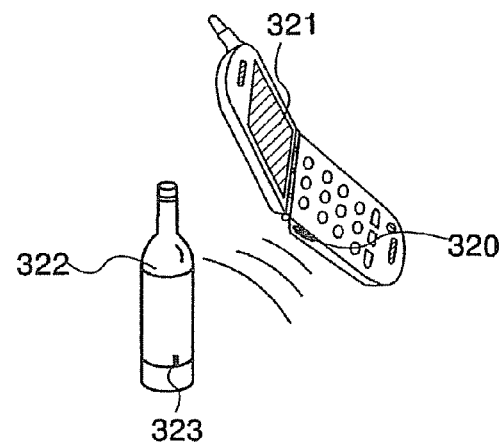
Figure 8C:
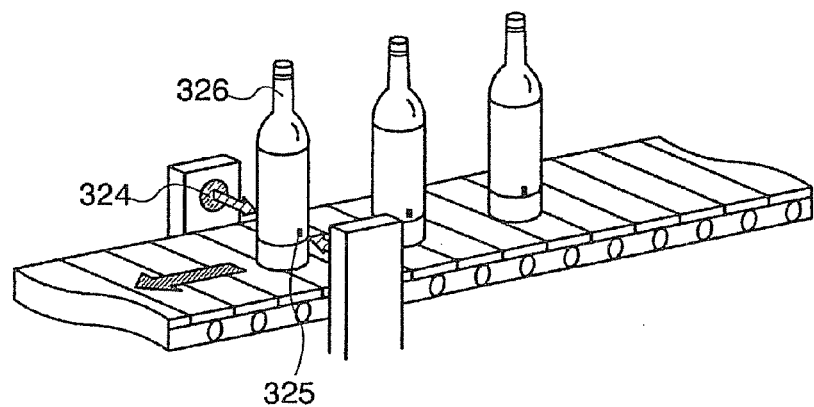

The wireless chip 20 has a function to communicate data without contact and includes a power supply circuit 11, a clock generating circuit 12, a data demodulation/modulation circuit 13, a control circuit 14 for controlling other circuits, an interface circuit 15, a memory circuit 16, a data bus 17, and an antenna (antenna coil) 18 (FIG. 8A). The power supply circuit 11 generates various power to be supplied to each circuit in the semiconductor device based on an AC electrical signal inputted from the antenna 18. The clock generating circuit 12 generates various clock signals to be supplied to each circuit in the semiconductor device based on the AC electrical signal inputted from the antenna 18. The data demodulation/modulation circuit 13 has a function to demodulate/modulate data to communicate with a reader/writer 19. The control circuit 14 has a function to control the memory circuit 16. The antenna 18 has a function to transmit and receive electric filed or electromagnetic waves. The reader/writer 19 controls the process regarding communication with the semiconductor device and control of the semiconductor device, and data thereof.

The memory circuit 16 has one of the structures of each organic memory shown in the above embodiment modes. A wireless chip is not limited to the aforementioned structure and may be additionally provided with other elements such as a limiter circuit of power supply voltage and a decoding hardware.

As for the wireless chip in this embodiment mode, a type in which power supply voltage is supplied to each circuit by electric waves without mounting a power supply (buttery); another type in which power supply voltage is supplied to each circuit by mounting a power supply (buttery) instead of an antenna, or still another type in which power supply voltage is supplied by electric waves and a power supply may be used.

It is advantages to use a semiconductor device of the present invention for a wireless chip or the like since non-contact communication is possible; multiple reading is possible; writing data is possible; processing into various shapes is possible; directivity is wide and a wide recognition range is provided depending on the selected frequency; and the like. The wireless chip, can be applied to an IC tag which can identify individual information of a person or a thing in non-contact wireless communication, a label which is enabled to be attached to an article by label processing, a wristband for an event or an amusement, or the like. In addition, the wireless chip may be processed with a resin material and may be directly fixed to a metal obstructing wireless communication. Further, the wireless chip can be utilized for operating a system such as an entering-leaving management system or a checkout system.

Next, one mode of the actual use of the semiconductor device of the present invention as the wireless chip will be explained. A reader/writer 320 is provided on the side of a portable terminal including a display area 321, and a wireless chip 323 is provided on the side of an article 322 (FIG. 8B). When the reader/writer 320 is held against the wireless chip 323 included in the article 320, information relating to a product, such as a raw material and a place of origin of the article, a test result in each production process, a history of distribution process, or further, description of the product is displayed in the display area 321. In addition, a product 326 can be inspected by using a reader/writer 324 and a wireless chip 325 provided on the product 326 when the product 326 is transported with, a belt conveyor (FIG. 8C). In this manner, information can be easily obtained, and high functions and high added values are realized by utilizing a wireless chip for a system.

This embodiment mode can be freely combined with any of the above embodiment modes.

Embodiment Mode 6

The usage of a semiconductor device according to the present invention is wide-ranging. For example, the semiconductor device can be used for an electronic apparatus in which information is stored and displayed. For example, the semiconductor device can be used for an electronic device such as a television receiver, a computer, a portable information terminal including a cellular phone, a digital camera, a video camera, a navigation system. The case of applying the semiconductor device of the invention to a cellular phone will be described with reference to FIG. 9.

The cellular phone includes chassis 2700 and 2706, a panel 2701, a housing 2702, a printed wiring board 2703, an operation button 2704, a buttery 2705, and the like. The panel 2701 is incorporated into the housing 2702 so as to be freely detached/attached, and the housing 2702 is fitted into the printed wiring board 2703. The shape and size of the housing 2702 can be appropriately changed depending on an electronic apparatus into which the panel 2701 is incorporated. A plurality of packed semiconductor devices are mounted on the printed wiring board 2703, and the semiconductor device according to the invention can be used as one of the plurality of semiconductor devices. The plurality of semiconductor devices mounted on the printed wiring board 2703 each serves as a controller, a central processing unit (CPU), a memory, a power supply circuit, a audio processing circuit, a sending/receiving circuit, or the like.

The panel 2701 is connected to the printed wiring board 2703 through a connection film 2708. The panel 2701, the housing 2702, and the printed wiring board 2703 described above are placed inside the chassis 2700 and 2706 along with the operation button 2704 and the buttery 2705. A pixel area 2709 included in the panel 2701 is disposed so as to be seen through an opening window provided on the chassis 2700.

The semiconductor device according to the invention has features of small size, thinness, and lightweight. According to the features, limited space inside the chassis 2700 and 2706 of an electronic apparatus can be effectively utilized. A semiconductor device according to the invention has a feature of including a memory circuit having a simple structure, and according to the above feature, an electronic apparatus using a semiconductor device having an inexpensive and highly integrated memory circuit can be provided. Further, the semiconductor device according to the invention has a feature of including a memory circuit which is nonvolatile and able to write once and be read many, and due to the above features, an electronic apparatus in which high functions and high added values are realized can be provided.

The semiconductor device according to the invention can be utilized as a wireless chip. For example, the semiconductor device can be used by being provided on paper money, coin, securities, certificates, bearer bonds, packing containers, documents, recording media, commodities, vehicles, foods, garments, health articles, livingwares, medicines, electronic apparatuses, and the like. These examples will be explained with reference to FIGS. 10A to 10H.

The paper money and coins are money distributed in the market and include currency (cash vouchers) available in a certain area in a similar way to money, and memorial coins. The securities refer to checks, stock certificates, promissory notes, and the like (FIG. 10A). The certificates refer to driver's licenses, certificates of residence, and the like (FIG. 10B). The bearer bonds refer to stamps, rice coupons, various merchandise coupons, and the like (FIG. 10C). The packing containers refer to wrapping paper for a box lunch, plastic bottles, and the like (FIG. 10D). The documents refer to volumes, books and the like (FIG. 10E). The recording media refer to DVD software, video tapes, and the like (FIG. 10F). The vehicles refer to wheeled vehicles such as bicycles, vessels, and the like (FIG. 10G). The commodities refer to bags, glasses, and the like (FIG. 10H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

Counterfeits can be prevented by providing a wireless chip on the paper money, coin, securities, certificates, bearer bonds, and the like. The efficiency of an inspection system or a system used in a rental shop can be improved by providing a wireless chip on packing containers, documents, recording media, commodities, foods, livingwares, electronic apparatuses, or the like. By providing a wireless chip on each of the vehicles, health articles, medicines, and the like, counterfeits or theft can be prevented, further, medicines can be prevented from being taken mistakenly. The wireless chip is provided on goods by being pasted on their surfaces or embedded thereinto. For example, the wireless chip may be embedded in a paper in the case of a book or embedded in an organic resin in the case of a package formed of the organic resin. In the case of writing (additionally writing) by optical operation afterward, a transparent material is preferably used so that a memory element provided on a chip is exposed to light. Further, counterfeits can be effectively prevented by using a memory element in which once-written data cannot be changed. Problems such as privacy after a user purchases a product can be solved by providing a system for erasing data of a memory element provided on a wireless chip.

The efficiency of an inspection system, a system used in a rental shop, or the like can be improved by providing a wireless chip on, for example, packing containers, recording media, commodities, foods, garments, livingwares, electronic apparatuses, or the like. Counterfeits or theft can be prevented by providing a wireless chip on vehicles. Individual creatures can be easily identified by implanting a wireless chip in creatures such as animals. For example, year of birth, sex, breed, and the like can be easily identified by implanting a wireless chip in creatures such as domestic animals.

As described above, a semiconductor device according to the invention can be provided on anything as long as they are goods which store data. This embodiment mode can be freely combined with the any of the above embodiment modes.

Embodiment 1

In this embodiment, a memory element portion is manufactured over a substrate, and the result of reading data into the memory element portion by electric action will be described.

The memory element portion is an element in which a first conductive layer, an organic compound layer (a layer formed with a mixed layer of an organic compound and an inorganic compound, and an organic compound material), a second conductive layer are stacked in order over a substrate (the structure is hereinafter referred to as an element structure 1). Indium tin oxide containing silicon oxide was used for the first conductive layer. A layered structure including a mixed layer of an organic compound and an inorganic compound, and a layer formed of an organic compound material was used for the organic compound layer. The mixed layer of an organic compound and an inorganic compound was formed by co-evaporating 4,4'-bis[N-(1-naphthyl)-N-phenylamino]biphenyl (this material may be abbreviated to α-NPD) and MoO$_3$. 4,4'-bis[N-(3-methylphenyl)-N-phenylamino]biphenyl (this material may be abbreviated to TPD) was used for the layer formed of an organic compound material. Aluminum was used for the second conductive layer.

Further, by comparison with a memory element portion having the above structure, an element in which a first conductive layer a layer formed of an organic compound material, a second conductive layer are stacked in order over a substrate (the structure is hereinafter referred to as an element structure 2). The first conductive layer was formed using a compound of indium tin oxide containing silicon oxide, the layer formed of an organic compound material was formed using TPD, and the second conductive layer was formed using aluminum. Accordingly, in this structure, the mixed layer of an organic compound and an inorganic compound is excluded from the above structure.

Figure 17:
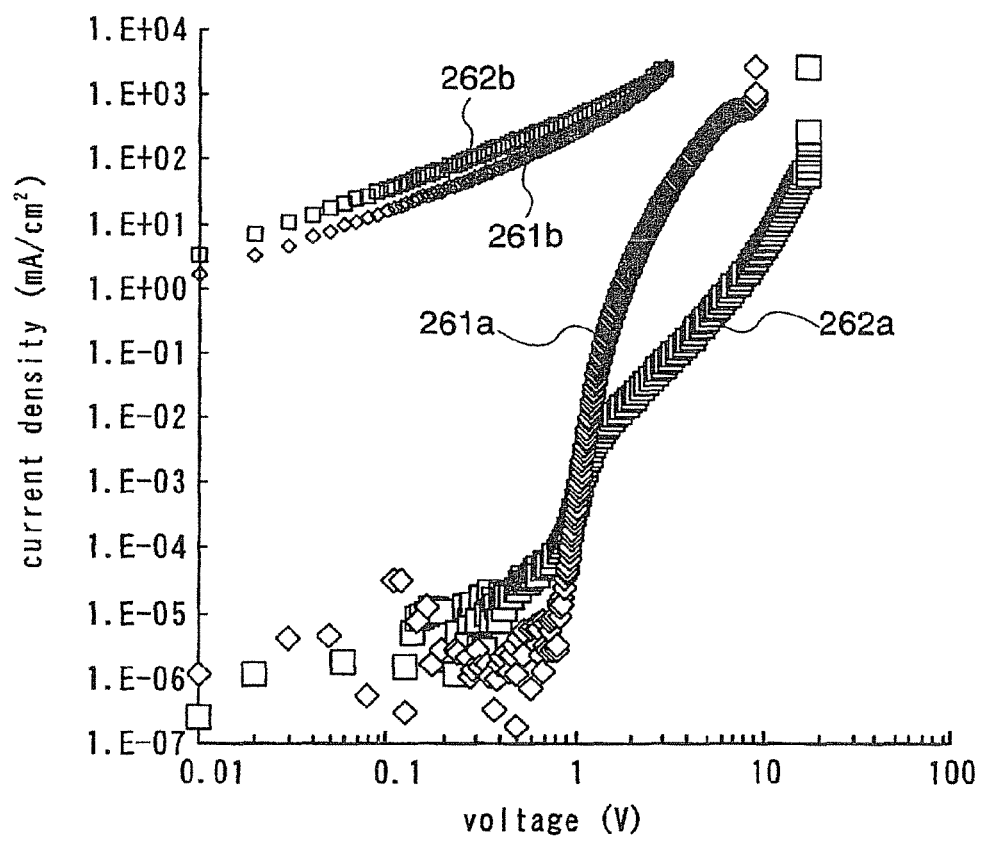
FIG. 17 is a measurement chart showing an I-V characteristic of a memory element in a semiconductor device of the present invention.

FIG. 17 shows the measurement result of the current-voltage characteristics of the element structure 1 and the element structure 2 before the memory element portion is shorted by electric action and after the memory element portion is shorted by electric action. Note that, in FIG. 17, the horizontal axis represents voltage values (V) and the vertical axis represents current density (mA/cm$^2$). Further, in FIG. 17, a plot 261a shows current-voltage characteristics of the element structure 1 before the memory element portion is shorted by electric action, a plot 261b shows current-voltage characteristics of the element structure 1 after the memory element portion is shorted by electric action, a plot 262a shows current-voltage characteristics of the element structure 2 before the memory element portion is shorted by electric action, and a plot 262b shows current-voltage characteristics of the element structure 2 after the memory element portion is shorted by electric action.

From FIG. 17, substantial change in current-voltage characteristics of the element structure 1 and the element structure 2 before and after shorting the memory element portion. For example, respective current densities of the element structure 1 and the element structure 2 before shorting the memory element portion are 1.6×10$^{-4}$ mA/cm$^2$ and 2.4×10$^{-4}$ at an applied voltage of 1 V, whereas respective current densities of the element structure 1 and the element structure 2 after shorting the memory element portion are 2.5×10$^2$ mA/cm$^2$ and 4.3×10$^2$ mA/cm$^2$ at an applied voltage of 1 V. Thus, the current density changes in six-digit orders of magnitude before and after shorting the memory element portion. In other words, resistances of the element structure 1 and the element structure 2 after shorting the memory element portion are significantly reduced compared with before shoring the memory element portion.

As described above, the resistance of the memory element portion is changed comparing before and after shorting the memory element portion. The memory element portion can function as a memory circuit by reading the change in the element structure 1 and the element structure 2 by voltage values or current density values.

Further, as shown in FIG. 17, the voltages applied for shorting the memory element portion in the element structure 1 and the element structure 2 by electric action were respectively 9.6 V and 18.2 V, and the memory element portion of the element structure 1 can be shorted at a lower voltage. Accordingly, when a stack of a layer formed of an organic compound material and a mixed layer of an organic compound and an inorganic compound is provided as the organic compound layer, the drive voltage for writing data can be lowered by shorting the memory element portion. Consequently, the thickness of the memory element portion can be increased and the power consumption thereof can be reduced at the same time by providing a mixed layer of an organic compound material and an inorganic compound material in addition to a layer formed of an organic compound material for the organic compound layer.

Embodiment 2

In this embodiment, the thickness dependency of the organic compound layer with respect to write voltage, the write current value, and current density of an organic memory element will be shown. Here, voltage was applied to the organic memory element and writing was conducted by shorting the organic memory.

As a first conductive layer, ITO containing silicon oxide was formed by sputtering over a glass substrate. As a layer provided over the first conductive layer by mixing an organic compound and an inorganic compound, molybdenum oxide and DNTPD (4,4'-bis(N-{4-[N,N-bis(3-methylphenyl)amino]phenyl}-N-phenylamino)biphenyl) were co-evaporated at the ratio of 2:4. As an organic compound layer, NPB was vapor deposited over the layer provided by mixing an organic compound and an inorganic compound. As a second conductive layer, an aluminum layer was vapor deposited over the organic compound layer. Thus, an organic memory element was formed to have a size of 100 μm×100 μm in a horizontal surface of the organic memory element.

Note that the organic memory elements were formed so that the layer provided by mixing an organic compound and an inorganic compound had a thickness of 80 nm, and the thickness of each organic compound layer was 10 nm, 20 nm, 30 nm, 40 nm, and 50 nm. Further, an organic memory element having a 10 nm thick organic compound layer was used as Sample 1, an organic memory element having a 20 nm thick organic compound layer was used as Sample 2, an organic memory element having a 30 nm thick organic compound layer was used as Sample 3, an organic memory element having a 40 nm thick organic compound layer was used as Sample 4, and an organic memory element having a 50 nm thick organic compound layer was used as Sample 5. The write voltage, current value, and current density are shown in Chart 1.

CHART 1

| sample | Thickness of organic compound (nm) | Writing voltage (V) | Current value (A) | Current density (A/μm$^2$) |
|---|---|---|---|---|
| 1 | 10 | 8.4 | 25 × 10$^{-3}$ | 2.52 × 10$^{-6}$ |
| 2 | 20 | 11.3 | 67 × 10$^{-3}$ | 6.7 × 10$^{-6}$ |
| 3 | 30 | 12.3 | 48 × 10$^{-3}$ | 4.7 × 10$^{-6}$ |
| 4 | 40 | 12.0 | 2.5 × 10$^{-3}$ | 2.5 × 10$^{-6}$ |
| 5 | 50 | 19.2 | 2.0 × 10$^{-3}$ | 0.20 × 10$^{-6}$ | thickness of layer provided by mixing inorganic compound and organic compound: 80 nm As shown in Chart 1, making the thickness of the organic compound layer thin, write voltage can be lowered.

Next, voltages and current values in writing organic memory elements having different sizes in the horizontal surface, and layers provided by mixing an organic compound and an inorganic compound with different thicknesses are shown. Here, voltage was applied to the organic memory element and writing was similarly conducted by shorting the organic memory.

A titan layer was formed by sputtering over a glass substrate as a first conductive layer. Molybdenum oxide and NPB were co-evaporated over the first conductive layer, as a layer provided by mixing an organic compound and an inorganic compound. NPB was vapor deposited over the layer provided by mixing an organic compound and an inorganic compound, as an organic compound layer. An aluminum layer was vapor deposited over the organic compound layer, as a second conductive layer. In such a way, organic memory elements were formed.

Note that organic memory elements, in each of which the layer provided by mixing an organic compound and an inorganic compound had a thickness of 20 nm, and the mixing ratio of molybdenum oxide and NPB was 1:4, having sides of the organic memory elements of 3 µm and 5 µm were respectively used as Sample 6 and Sample 7. Voltages and current values in writing in these samples are shown in Chart 2.

CHART 2

| sample | Sides of the organic memory element (µm) | Writing voltage (V) | Current value (A) |
| --- | --- | --- | --- |
| 6 | 3 | 2.7 | $385 \times 10^{-6}$ |
| 7 | 5 | 39.3 | $23 \times 10^{-12}$ | thickness of layer provided by mixing inorganic compound and organic compound: 20 nm Note that organic memory elements, in each of which the layer provided by mixing an organic compound and an inorganic compound had a thickness of 40 nm, and the mixing ratio of molybdenum oxide and NPB was 1:4, having the sides of the organic memory elements of 2 µm, 5 µm, and 10 µm were respectively used as Sample 8, Sample 9, and Sample 10. Voltages and current values in writing in these samples are shown in Chart 3.

CHART 3

| Sample | Sides of the organic memory element (µm) | Writing voltage (V) | Current value (A) |
| --- | --- | --- | --- |
| 8 | 2 | 22.9 | $0.1 \times 10^{-6}$ |
| 9 | 5 | 11.3 | $1374 \times 10^{-6}$ |
| 10 | 10 | 9.4 | $1910 \times 10^{-6}$ | thickness of layer provided by mixing inorganic compound and organic compound: 30 nm As shown in Charts 1 to 3, in organic memory elements each including a layer provided by mixing an organic compound and an inorganic compound, it was possible to write by electric action.

What is claimed is:

1. A method for manufacturing a semiconductor device, comprising the steps of:
    forming a plurality of transistors including at least a first transistor and a second transistor over a substrate;
    forming a first conductive layer electrically connected to the first transistor and a second conductive layer electrically connected to the second transistor;
    selectively forming an insulating layer so as to cover end portions of the first conductive layer and the second conductive layer;
    forming a conductive layer functioning as an antenna so as to electrically connect to the first conductive layer;
    forming an organic compound layer so as to cover the second conductive layer after forming the conductive layer functioning as an antenna; and
    forming a third conductive layer so as to cover the organic compound layer.

2. A method for manufacturing a semiconductor device according to claim 1,
    wherein the conductive layer functioning as an antenna is formed by heating a conductive paste which is provided by screen printing or a droplet discharge method.

3. A method for manufacturing a semiconductor device according to claim 1,
    wherein the organic compound layer is formed with a layer in which an inorganic compound and an organic compound are mixed.

* * * * *